United States Patent
Song et al.

(10) Patent No.: US 11,972,812 B2
(45) Date of Patent: Apr. 30, 2024

(54) NON-VOLATILE MEMORY WITH DATA REFRESH BASED ON DATA STATES OF ADJACENT MEMORY CELLS

(71) Applicant: SanDisk Technologies LLC, Addison, TX (US)

(72) Inventors: Yi Song, San Jose, CA (US); Jiahui Yuan, Fremont, CA (US); Jun Wan, San Jose, CA (US); Deepanshu Dutta, Fremont, CA (US)

(73) Assignee: SanDisk Technologies LLC, Austin, TX (US)

( * ) Notice: Subject to any disclaimer, the term of this patent is extended or adjusted under 35 U.S.C. 154(b) by 218 days.

(21) Appl. No.: 17/549,431

(22) Filed: Dec. 13, 2021

(65) Prior Publication Data
US 2023/0187000 A1  Jun. 15, 2023

(51) Int. Cl.
G11C 16/34 (2006.01)
G11C 16/08 (2006.01)
G11C 16/10 (2006.01)
G11C 16/26 (2006.01)

(52) U.S. Cl.
CPC ......... *G11C 16/3459* (2013.01); *G11C 16/08* (2013.01); *G11C 16/102* (2013.01); *G11C 16/26* (2013.01); *G11C 16/3404* (2013.01)

(58) Field of Classification Search
None
See application file for complete search history.

(56) References Cited

U.S. PATENT DOCUMENTS

| | | | |
|---|---|---|---|
| 8,214,700 B2 | 7/2012 | Chen | |
| 9,129,702 B2 | 9/2015 | Kim et al. | |
| 9,460,800 B2 | 10/2016 | Lee et al. | |
| 9,563,504 B2 | 2/2017 | Liang et al. | |
| 9,720,616 B2 | 8/2017 | Yu et al. | |
| 10,074,419 B2 | 9/2018 | Bedeschi et al. | |
| 2008/0019188 A1 | 1/2008 | Li | |
| 2008/0056007 A1* | 3/2008 | Kang | G11C 11/5628 365/185.03 |
| 2009/0219761 A1* | 9/2009 | Moschiano | G11C 16/3454 365/185.18 |
| 2012/0206967 A1 | 8/2012 | Lutze et al. | |

(Continued)

OTHER PUBLICATIONS

PCT International Search Report and Written Opinion dated Oct. 7, 2022, PCT Patent Application No. PCT/US2022/029507.
U.S. Appl. No. 17/135,467, filed Dec. 28, 2020.

*Primary Examiner* — J. H. Hur
(74) *Attorney, Agent, or Firm* — Vierra Magen Marcus LLP

(57) ABSTRACT

A memory system identifies memory cells connected to a common word line that have had their threshold voltage unintentionally drift lower than programmed by determining whether memory cells meet two criteria: (1) the memory cells have threshold voltages within an offset of a read compare voltage of a data state; and (2) adjacent memory cells (connected to word lines that are adjacent to the common word line) are in one or more low data states. For those memory cells meeting the two criteria, the memory system performs some amount of programming on the memory cells to refresh the data stored in those memory cells to be as originally intended.

20 Claims, 24 Drawing Sheets

(56) References Cited

U.S. PATENT DOCUMENTS

| | | | |
|---|---|---|---|
| 2012/0239976 A1* | 9/2012 | Cometti | G11C 16/26 |
| | | | 714/24 |
| 2012/0320683 A1 | 12/2012 | Li | |
| 2013/0010537 A1* | 1/2013 | Kawai | G11C 16/10 |
| | | | 365/185.18 |
| 2014/0119115 A1 | 5/2014 | Jung et al. | |
| 2017/0116075 A1 | 4/2017 | Yang et al. | |
| 2019/0088315 A1 | 3/2019 | Saenz et al. | |

* cited by examiner

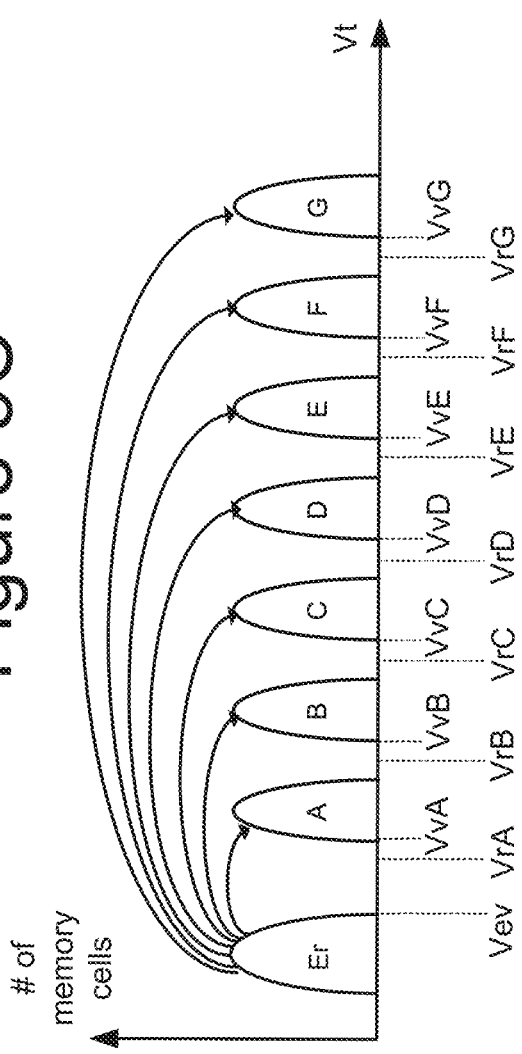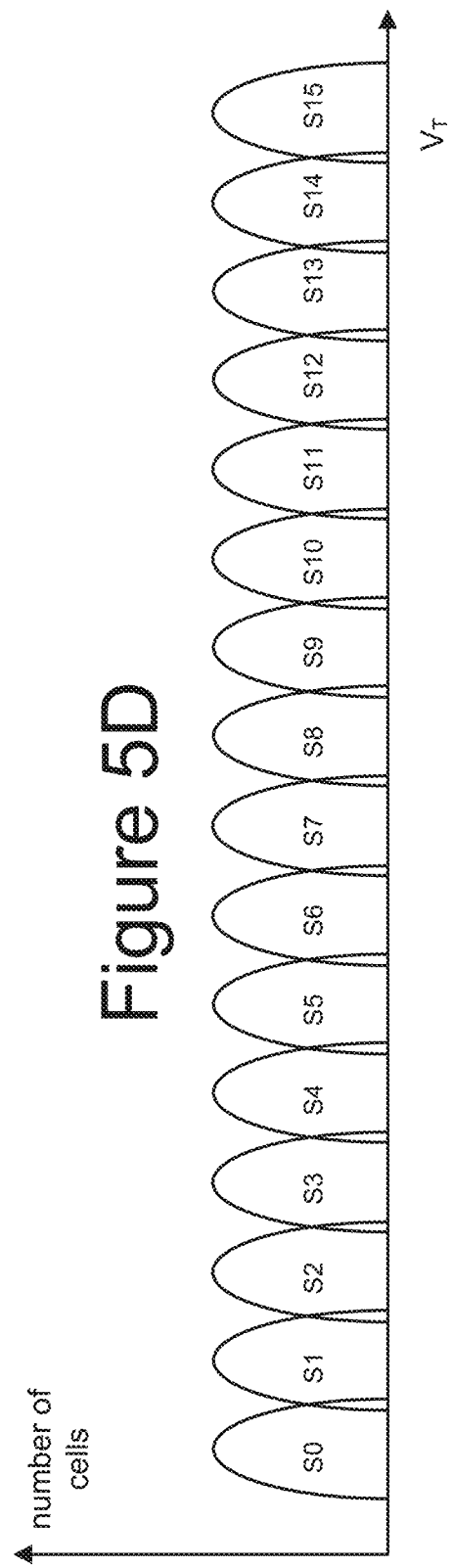

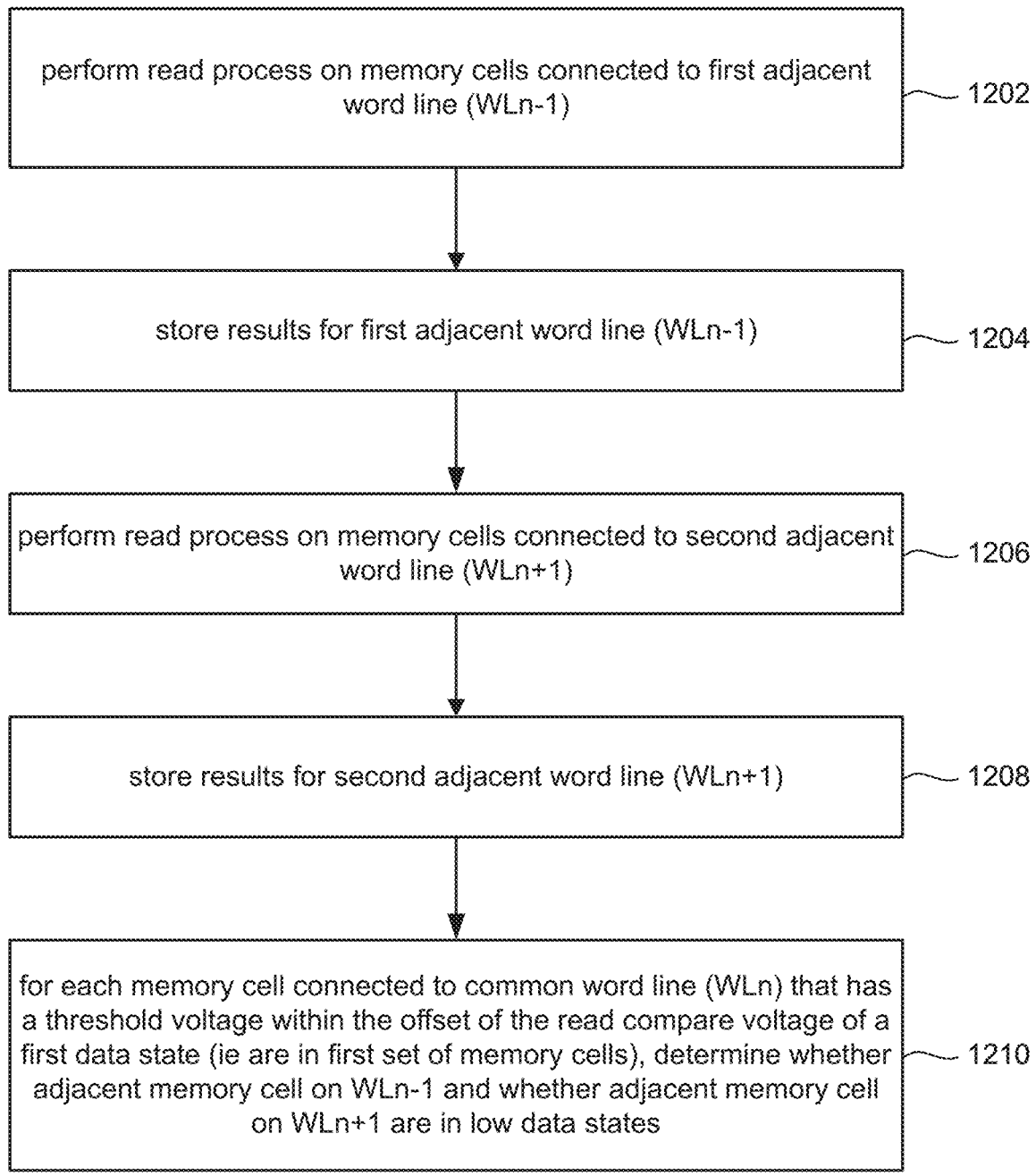

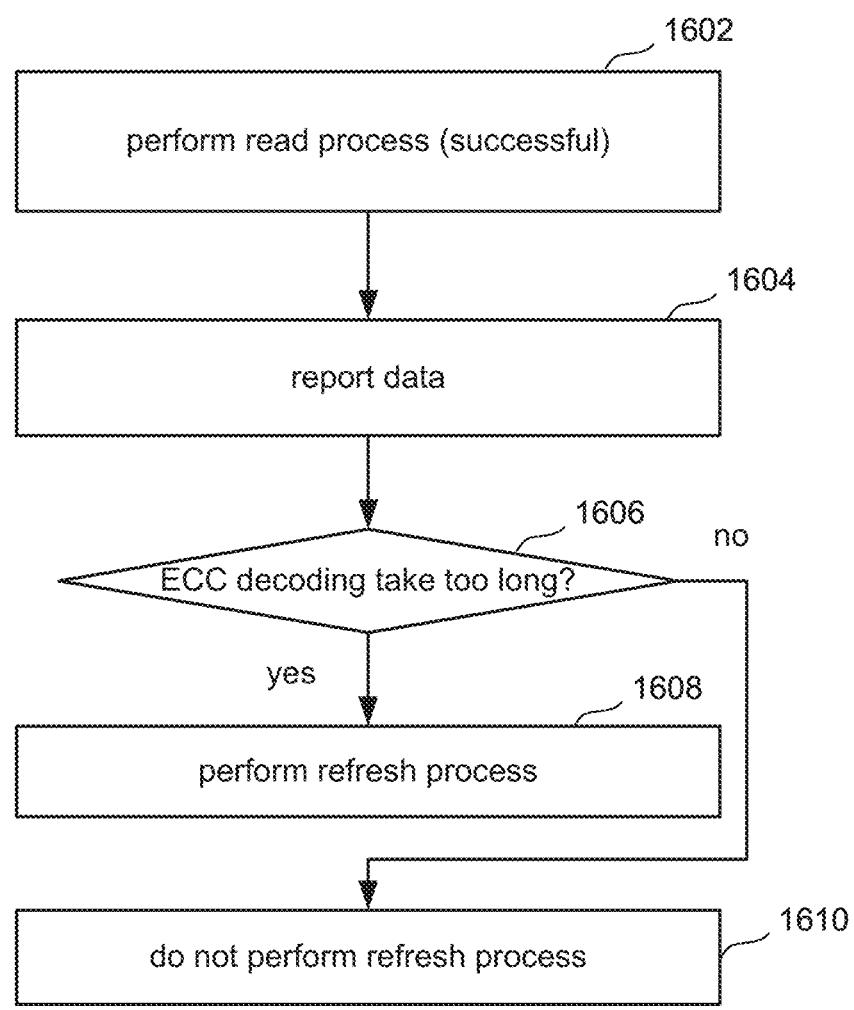

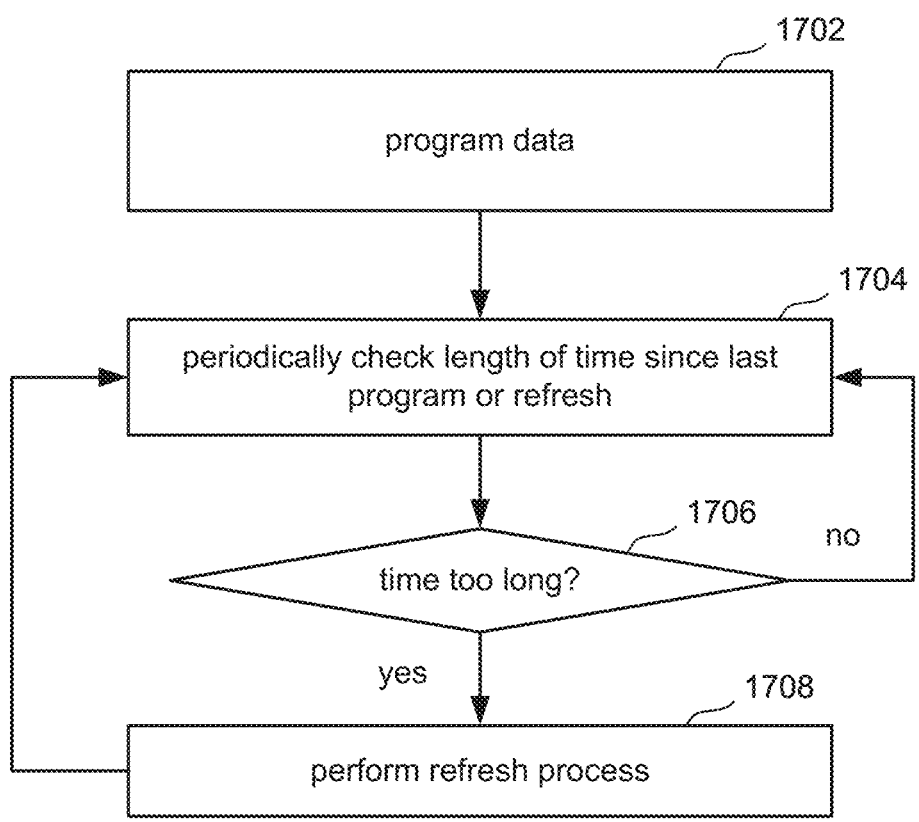

NON-VOLATILE MEMORY WITH DATA REFRESH BASED ON DATA STATES OF ADJACENT MEMORY CELLS

BACKGROUND

The present disclosure relates to non-volatile storage.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). One example of non-volatile memory is flash memory (e.g., NAND-type and NOR-type flash memory).

Users of non-volatile memory can program (i.e., write) data to the non-volatile memory and later read that data back. For example, a digital camera may take a photograph and store the photograph in non-volatile memory. Later, a user of the digital camera may view the photograph by having the digital camera read the photograph from the non-volatile memory. Because users often rely on the data they store, it is important to users of non-volatile memory to be able to store data reliably so that it can be read back successfully.

BRIEF DESCRIPTION OF THE DRAWINGS

Like-numbered elements refer to common components in the different figures.

FIG. 5C depicts threshold voltage distributions.

FIG. 5D depicts threshold voltage distributions.

FIG. 12 is a flow chart describing one embodiment of a process for identifying memory cells with neighbor memory cells in low data states.

FIG. 16 is a flow chart describing one embodiment of a process for reading and refreshing data.

FIG. 17 is a flow chart describing one embodiment of a process for refreshing data.

DETAILED DESCRIPTION

In some non-volatile memory, charge stored in a memory cell may leak over a long period of time after the memory cell is programmed. If the data being stored is read after there has been sufficient leakage of charge, then an error can occur. This phenomenon is referred to as a data retention issue To prevent errors when reading data due to a data retention issue, a memory system is proposed that identifies memory cells that have had their threshold voltage unintentionally drift lower than programmed and refreshes the data for those memory cells to be as originally intended, therefore, avoiding errors when reading the data. One embodiment includes identifying memory cells that have threshold voltages within an offset of a read compare voltage for a particular data state and that have adjacent memory cells in one or more low data states. Those identified memory cells receive some amount of programming in order to refresh the data to be as originally intended.

Figure 1:
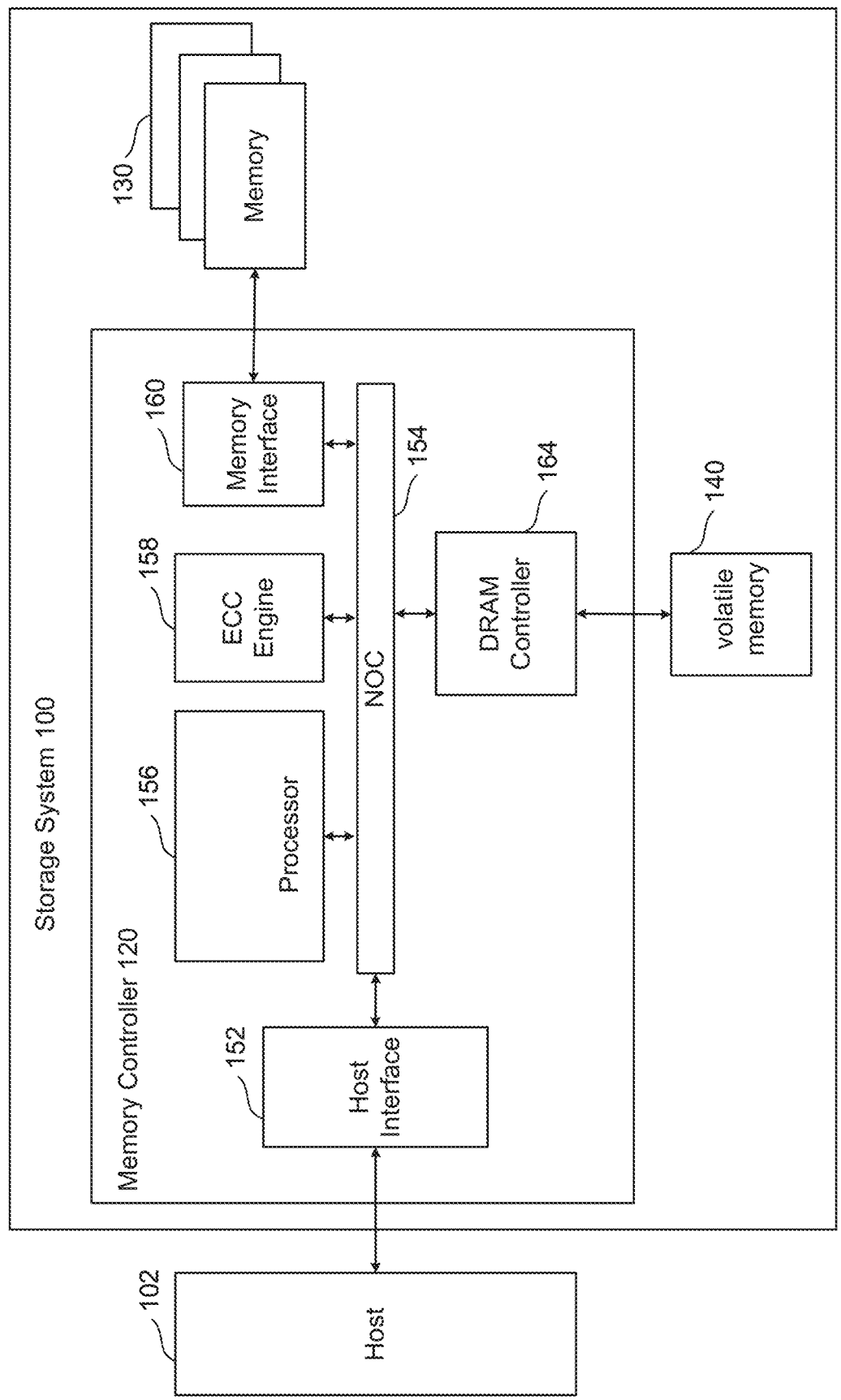
FIG. 1 is a block diagram depicting one embodiment of a storage system.

FIG. 1 is a block diagram of one embodiment of a storage system 100 that implements the proposed technology described herein. In one embodiment, storage system 100 is a solid state drive ("SSD"). Storage system 100 can also be a memory card, USB drive or other type of storage system. The proposed technology is not limited to any one type of memory system. Storage system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, storage system 100. In other embodiments, storage system 100 is embedded within host 102.

The components of storage system 100 depicted in FIG. 1 are electrical circuits. Storage system 100 includes a memory controller 120 connected to non-volatile memory 130 and local high speed volatile memory 140 (e.g., DRAM). Local high speed volatile memory 140 is used by memory controller 120 to perform certain functions. For example, local high speed volatile memory 140 stores logical to physical address translation tables ("L2P tables").

Memory controller 120 comprises a host interface 152 that is connected to and in communication with host 102. In one embodiment, host interface 152 implements a NVM Express (NVMe) over PCI Express (PCIe). Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, and memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To implement this system, memory controller 120 (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with non-volatile memory 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
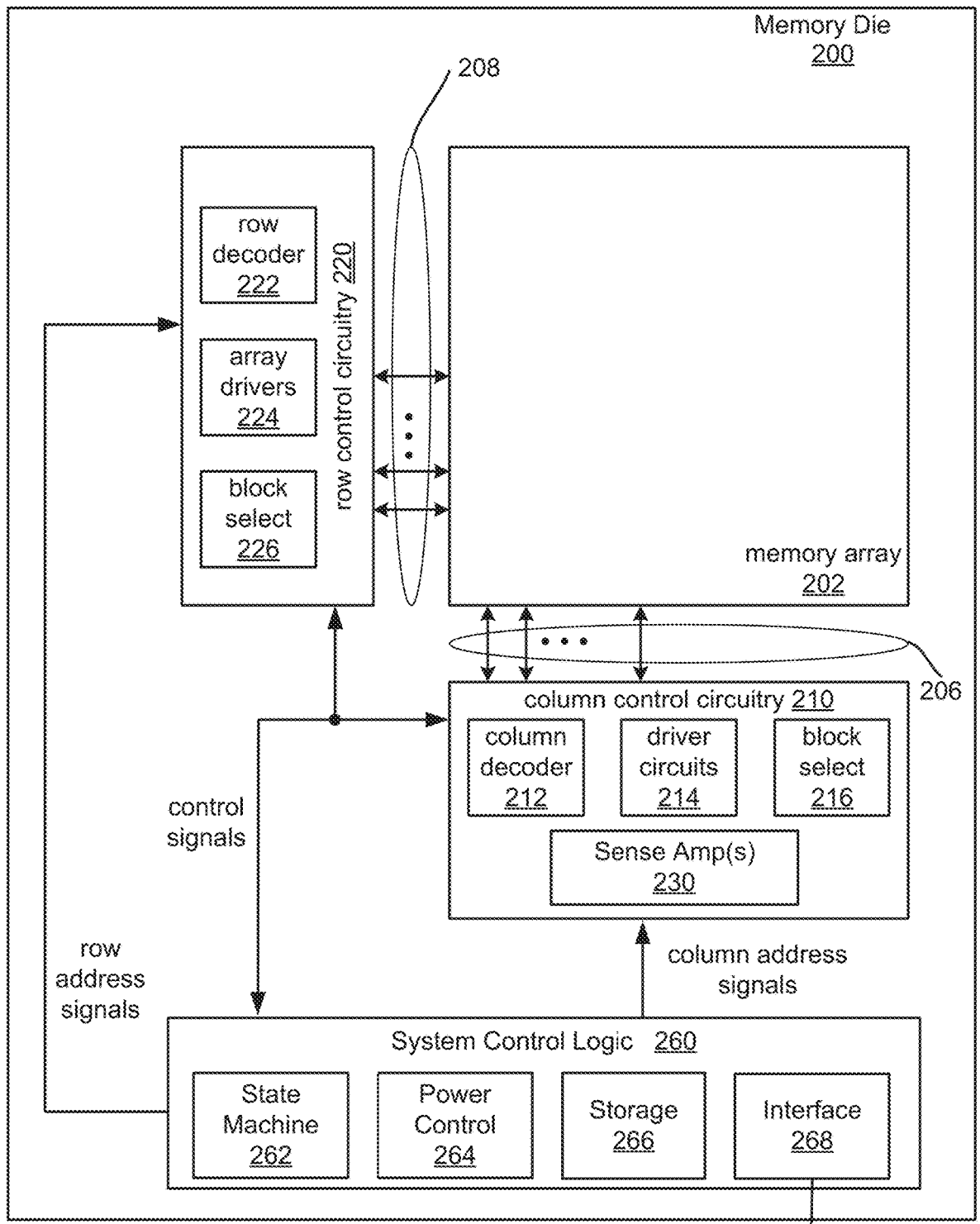
FIG. 2A is a block diagram of one embodiment of a memory die.

In one embodiment, non-volatile memory 130 comprises one or more memory die. FIG. 2A is a functional block diagram of one embodiment of a memory die 200 that comprises non-volatile memory 130. Each of the one or more memory die of non-volatile memory 130 can be implemented as memory die 200 of FIG. 2A. The components depicted in FIG. 2A are electrical circuits. Memory die 200 includes a memory array 202 that can comprise non-volatile memory cells, as described in more detail below. The array terminal lines of memory array 202 include the various layer(s) of word lines organized as rows, and the various layer(s) of bit lines organized as columns. However, other orientations can also be implemented. Memory die 200 includes row control circuitry 220, whose outputs 208 are connected to respective word lines of the memory array 202. Row control circuitry 220 receives a group of M row address signals and one or more various control signals from System Control Logic circuit 206, and typically may include such circuits as row decoders 222, array terminal drivers 224, and block select circuitry 226 for both reading and writing (programming) operations. Row control circuitry 220 may also include read/write circuitry. Memory die 200 also includes column control circuitry 210 including sense amplifier(s) 230 whose input/outputs 206 are connected to respective bit lines of the memory array 202. Although only single block is shown for array 202, a memory die can include multiple arrays that can be individually accessed. Column control circuitry 210 receives a group of N column address signals and one or more various control signals from System Control Logic 260, and typically may include such circuits as column decoders 212, array terminal receivers or driver circuits 214, block select circuitry 216, as well as read/write circuitry, and I/O multiplexers.

System control logic 260 receives data and commands from memory controller 120 and provides output data and status to the host. In some embodiments, the system control logic 260 (which comprises one or more electrical circuits) include state machine 262 that provides die-level control of memory operations. In one embodiment, the state machine 262 is programmable by software. In other embodiments, the state machine 262 does not use software and is completely implemented in hardware (e.g., electrical circuits). In another embodiment, the state machine 262 is replaced by a micro-controller or microprocessor, either on or off the memory chip. System control logic 262 can also include a power control module 264 that controls the power and voltages supplied to the rows and columns of the memory structure 202 during memory operations and may include charge pumps and regulator circuit for creating regulating voltages. System control logic 262 includes storage 366 (e.g., RAM, registers, latches, etc.), which may be used to store parameters for operating the memory array 202.

Commands and data are transferred between memory controller 120 and memory die 200 via memory controller interface 268 (also referred to as a "communication interface"). Memory controller interface 268 is an electrical interface for communicating with memory controller 120. Examples of memory controller interface 268 include a Toggle Mode Interface and an Open NAND Flash Interface (ONFI). Other I/O interfaces can also be used.

In some embodiments, all the elements of memory die 200, including the system control logic 260, can be formed as part of a single die. In other embodiments, some or all of the system control logic 260 can be formed on a different die.

In one embodiment, memory structure 202 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping layers.

In another embodiment, memory structure 202 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 202 is not limited to the examples above. Many different types of memory array architectures or memory technologies can be used to form memory structure 202. No particular non-volatile memory technology is required for purposes of the new claimed embodiments proposed herein. Other examples of suitable technologies for memory cells of the memory structure 202 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 202 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 2A can be grouped into two parts: (1) memory structure 202 and (2) peripheral circuitry, which includes all the components depicted in FIG. 2A other than memory structure 202. An important characteristic of a memory circuit is its capacity, which can be increased by increasing the area of the memory die of storage system 100 that is given over to the memory structure 202; however, this reduces the area of the memory die available for the peripheral circuitry. This can place quite severe restrictions on these elements of the peripheral circuitry. For example, the need to fit sense amplifier circuits within the available area can be a significant restriction on sense amplifier design architectures. With respect to the system control logic 260, reduced availability of area can limit the available functionalities that can be implemented on-chip. Consequently, a basic trade-off in the design of a memory die for the storage system 100 is the amount of area to devote to the memory structure 202 and the amount of area to devote to the peripheral circuitry.

Another area in which the memory structure 202 and the peripheral circuitry are often at odds is in the processing involved in forming these regions, since these regions often involve differing processing technologies and the trade-off in having differing technologies on a single die. For example, when the memory structure 202 is NAND flash, this is an NMOS structure, while the peripheral circuitry is often CMOS based. For example, elements such sense amplifier circuits, charge pumps, logic elements in a state machine, and other peripheral circuitry in system control logic 260 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 2A onto separately formed dies that are then bonded together. More specifically, the memory structure 202 can be formed on one die (referred to as the memory die) and some or all of the peripheral circuitry elements, including one or more control circuits, can be formed on a separate die (referred to as the control die). For example, a memory die can be formed of just the memory elements, such as the array of memory cells of flash NAND memory, MRAM memory, PCM memory, ReRAM memory, or other memory type. Some or all the peripheral circuitry, even including elements such as decoders and sense amplifiers, can then be moved on to a separate control die. This allows each of the memory die to be optimized individually according to its technology. For example, a NAND memory die can be optimized for an NMOS based memory array structure, without worrying about the CMOS elements that have now been moved onto a control die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other die. Although the following will focus on a bonded memory circuit of one memory die and one control die, other embodiments can use more die, such as two memory die and one control die, for example.

Figure 2B:
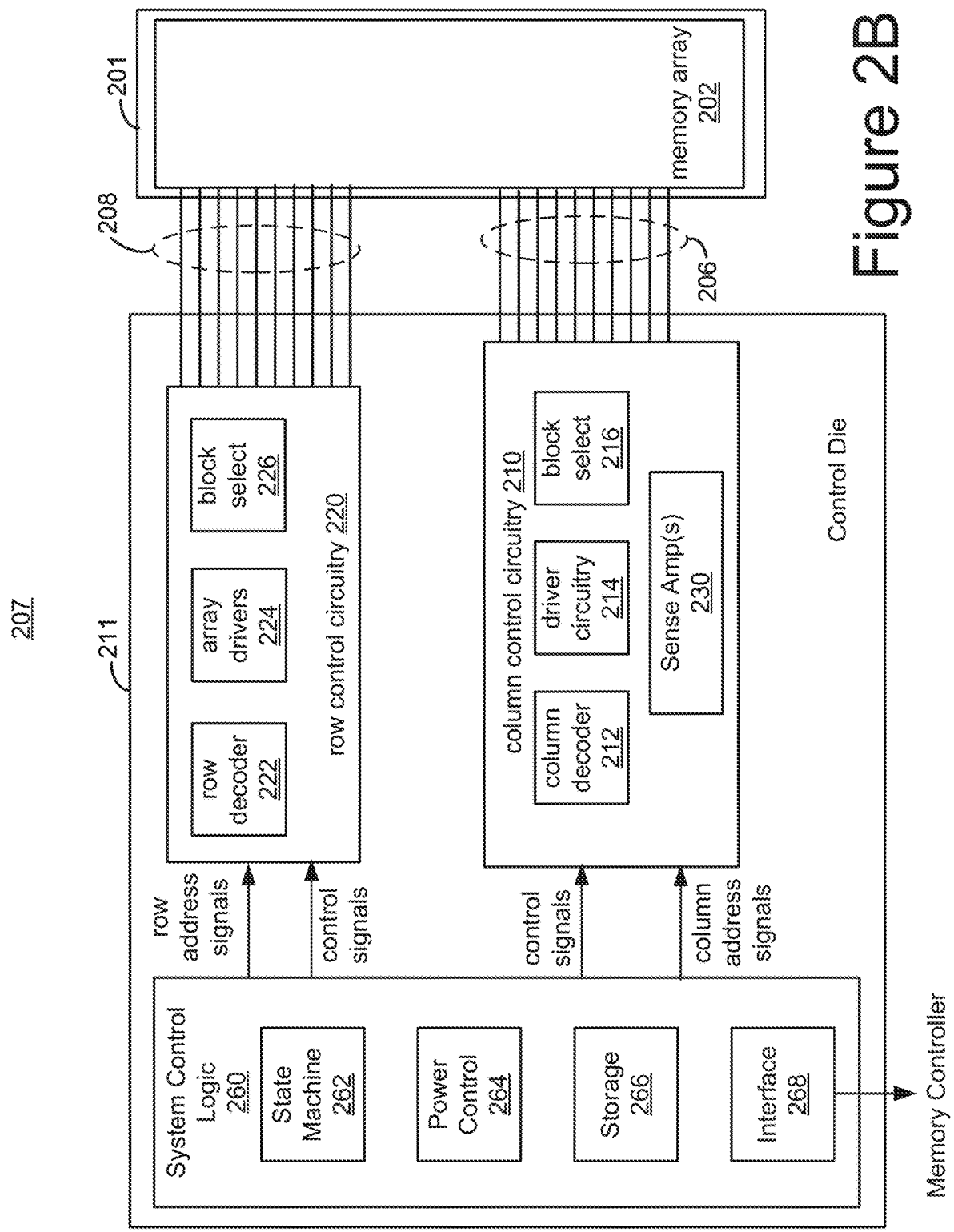
FIG. 2B is a block diagram of one embodiment of an integrated memory assembly.

FIG. 2B shows an alternative arrangement to that of FIG. 2A which may be implemented using wafer-to-wafer bonding to provide a bonded die pair. FIG. 2B depicts a functional block diagram of one embodiment of an integrated memory assembly 207. One or more integrated memory assemblies 207 may be used to implement the non-volatile memory 130 of storage system 100. The integrated memory assembly 207 includes two types of semiconductor die (or more succinctly, "die"). Memory die 201 includes memory structure 202. Memory structure 202 includes non-volatile memory cells. Control die 211 includes control circuitry 260, 210, and 220 (as described above). In some embodiments, control die 211 is configured to connect to the memory structure 202 in the memory die 201. In some embodiments, the memory die 201 and the control die 211 are bonded together.

FIG. 2B shows an example of the peripheral circuitry, including control circuits, formed in a peripheral circuit or control die 211 coupled to memory structure 202 formed in memory die 201. Common components are labelled similarly to FIG. 2A. System control logic 260, row control circuitry 220, and column control circuitry 210 are located in control die 211. In some embodiments, all or a portion of the column control circuitry 210 and all or a portion of the row control circuitry 220 are located on the memory die 201. In some embodiments, some of the circuitry in the system control logic 260 is located on the on the memory die 201.

System control logic 260, row control circuitry 220, and column control circuitry 210 may be formed by a common process (e.g., CMOS process), so that adding elements and functionalities, such as ECC, more typically found on a memory controller 120 may require few or no additional process steps (i.e., the same process steps used to fabricate controller 120 may also be used to fabricate system control logic 260, row control circuitry 220, and column control circuitry 210). Thus, while moving such circuits from a die such as memory 2 die 201 may reduce the number of steps needed to fabricate such a die, adding such circuits to a die such as control die 211 may not require many additional process steps. The control die 211 could also be referred to as a CMOS die, due to the use of CMOS technology to implement some or all of control circuitry 260, 210, 220.

FIG. 2B shows column control circuitry 210 including sense amplifier(s) 230 on the control die 211 coupled to memory structure 202 on the memory die 201 through electrical paths 206. For example, electrical paths 206 may provide electrical connection between column decoder 212, driver circuitry 214, and block select 216 and bit lines of memory structure 202. Electrical paths may extend from column control circuitry 210 in control die 211 through pads on control die 211 that are bonded to corresponding pads of the memory die 201, which are connected to bit lines of memory structure 202. Each bit line of memory structure 202 may have a corresponding electrical path in electrical paths 306, including a pair of bond pads, which connects to column control circuitry 210. Similarly, row control circuitry 220, including row decoder 222, array drivers 224, and block select 226 are coupled to memory structure 202 through electrical paths 208. Each of electrical path 208 may correspond to a word line, dummy word line, or select gate line. Additional electrical paths may also be provided between control die 211 and memory die 201.

For purposes of this document, the phrases "a control circuit" or "one or more control circuits" can include any one of or any combination of memory controller 120, state machine 262, all or a portion of system control logic 260, all or a portion of row control circuitry 220, all or a portion of column control circuitry 210, a microcontroller, a microprocessor, and/or other similar functioned circuits. The control circuit can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

Figure 3A:
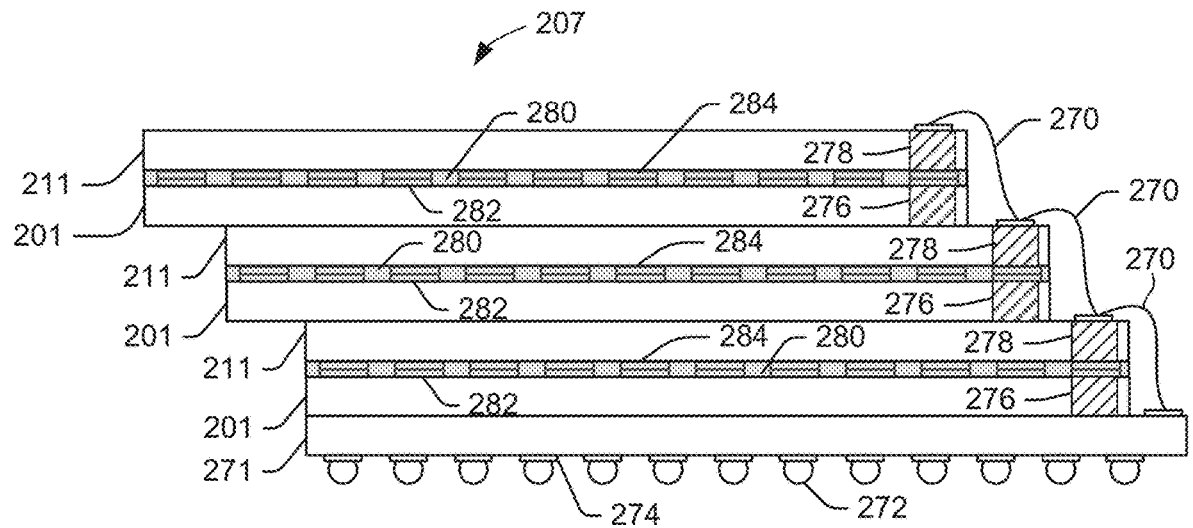
FIGS. 3A and 3B depict different embodiments of integrated memory assemblies.

In some embodiments, there is more than one control die 211 and more than one memory die 201 in an integrated memory assembly 207. In some embodiments, the integrated memory assembly 207 includes a stack of multiple control die 211 and multiple memory die 201. FIG. 3A depicts a side view of an embodiment of an integrated memory assembly 207 stacked on a substrate 271 (e.g., a stack comprising control dies 211 and memory dies 201). The integrated memory assembly 207 has three control dies 211 and three memory dies 201. In some embodiments, there are more than three memory dies 201 and more than three control die 211.

Each control die 211 is affixed (e.g., bonded) to at least one of the memory dies 201. Some of the bond pads 282/284 are depicted. There may be many more bond pads. A space between two dies 201, 211 that are bonded together is filled with a solid layer 280, which may be formed from epoxy or other resin or polymer. This solid layer 280 protects the electrical connections between the dies 201, 211, and further secures the dies together. Various materials may be used as solid layer 280, but in embodiments, it may be Hysol epoxy resin from Henkel Corp., having offices in California, USA.

The integrated memory assembly 207 may for example be stacked with a stepped offset, leaving the bond pads at each level uncovered and accessible from above. Wire bonds 270 connected to the bond pads connect the control die 211 to the substrate 271. A number of such wire bonds may be formed across the width of each control die 211 (i.e., into the page of FIG. 3A).

A memory die through silicon via (TSV) 276 may be used to route signals through a memory die 201. A control die through silicon via (TSV) 278 may be used to route signals through a control die 211. The TSVs 276, 278 may be formed before, during or after formation of the integrated circuits in the semiconductor dies 201, 211. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package. The solder balls 272 may form a part of the interface between integrated memory assembly 207 and memory controller 120.

Figure 3B:
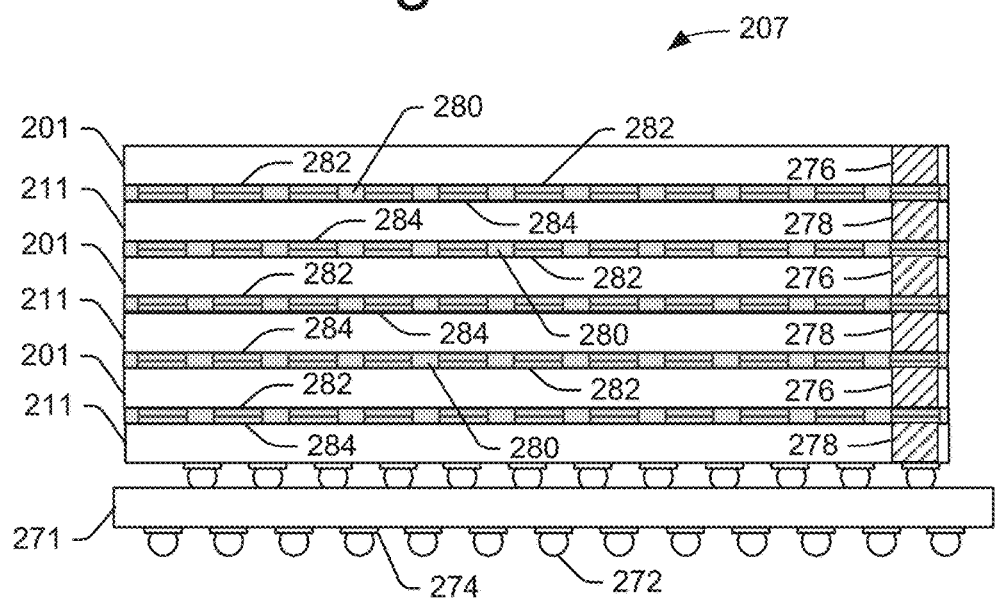

FIG. 3B depicts a side view of another embodiment of an integrated memory assembly 207 stacked on a substrate 271. The integrated memory assembly 207 of FIG. 3B has three control die 211 and three memory die 201. In some embodiments, there are many more than three memory dies 201 and many more than three control dies 211. In this example, each control die 211 is bonded to at least one memory die 201. Optionally, a control die 211 may be bonded to two or more memory die 201.

Some of the bond pads 282, 284 are depicted. There may be many more bond pads. A space between two dies 201, 211 that are bonded together is filled with a solid layer 280, which may be formed from epoxy or other resin or polymer. In contrast to the example in FIG. 3A, the integrated memory assembly 207 in FIG. 3B does not have a stepped offset. A memory die through silicon via (TSV) 276 may be used to route signals through a memory die 201. A control die through silicon via (TSV) 278 may be used to route signals through a control die 211.

Solder balls 272 may optionally be affixed to contact pads 274 on a lower surface of substrate 271. The solder balls 272 may be used to couple the integrated memory assembly 207 electrically and mechanically to a host device such as a printed circuit board. Solder balls 272 may be omitted where the integrated memory assembly 207 is to be used as an LGA package.

As has been briefly discussed above, the control die 211 and the memory die 201 may be bonded together. Bond pads on each die 201, 211 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 201, 211. Where no such film is initially provided, a space between the dies may be under filled with an epoxy or other resin or polymer. The under-fill material may be applied as a liquid which then hardens into a solid layer. This under-fill step protects the electrical connections between the dies 201, 211, and further secures the dies together. Various materials may be used as under-fill material, but in embodiments, it may be Hysol epoxy resin from Henkel Corp., having offices in California, USA.

Figure 4:
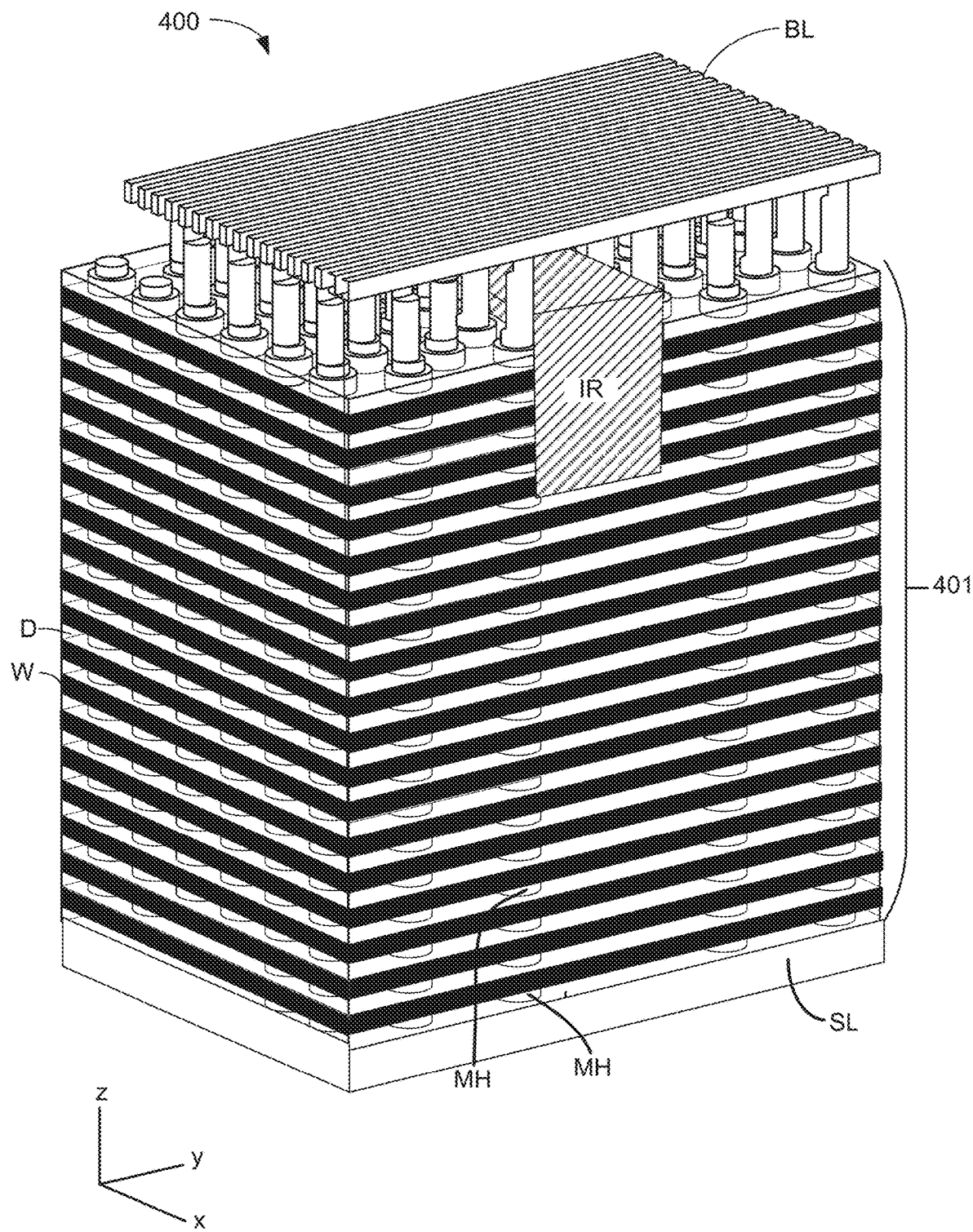
FIG. 4 is a perspective view of a portion of one embodiment of a monolithic three dimensional memory structure.

FIG. 4 is a perspective view of a portion of one example embodiment of a monolithic three dimensional memory array/structure that can comprise memory structure 202, which includes a plurality non-volatile memory cells arranged as vertical NAND strings. For example, FIG. 4 shows a portion 400 of one block of memory. The structure depicted includes a set of bit lines BL positioned above a stack 401 of alternating dielectric layers and conductive layers. For example, one of the dielectric layers is marked as D and one of the conductive layers (also called word line layers) is marked as W. The number of alternating dielectric layers and conductive layers can vary based on specific implementation requirements. As will be explained below, in one embodiment the alternating dielectric layers and conductive layers are divided into six (or a different number of) regions (e.g., sub-blocks) by isolation regions IR. FIG. 4 shows one isolation region IR separating two sub-blocks. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data. More details of the three dimensional monolithic memory array that comprises memory structure 202 is provided below.

Figure 4A:
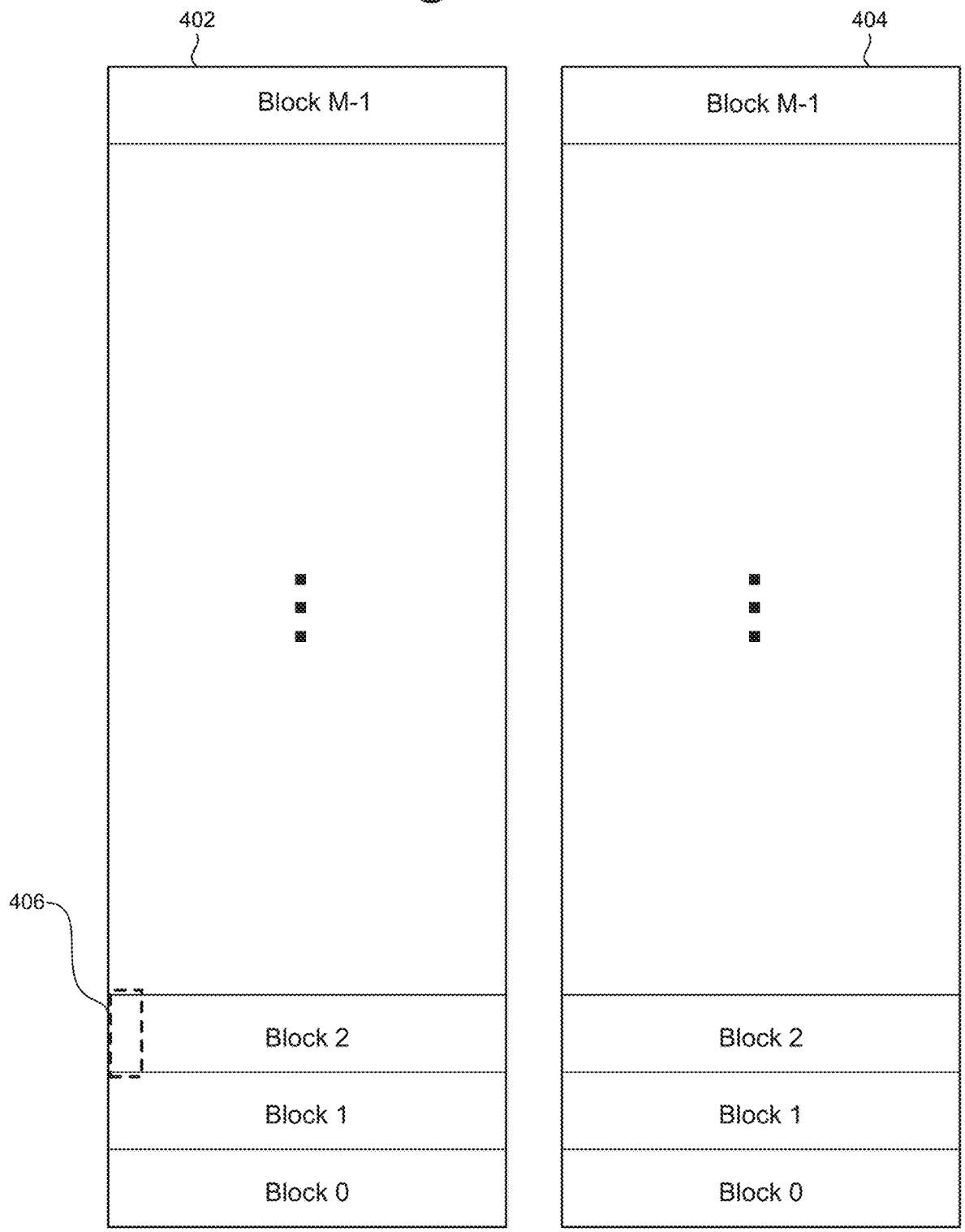
FIG. 4A is a block diagram of one embodiment of a memory structure having two planes.

FIG. 4A is a block diagram explaining one example organization of memory structure 202, which is divided into two planes 402 and 404. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, blocks can be divided into sub-blocks and the sub-blocks can be the unit of erase. Memory cells can also be grouped into blocks for other reasons, such as to organize the memory structure to enable the signaling and selection circuits. In some embodiments, a block represents a groups of connected memory cells as the memory cells of a block share a common set of word lines. For example, the word lines for a block are all connected to all the vertical NAND strings for that block. Although FIG. 4A shows two planes 402/404, more or less than two planes can be implemented. In some embodiments, memory structure 202 includes eight planes.

Figure 4B:
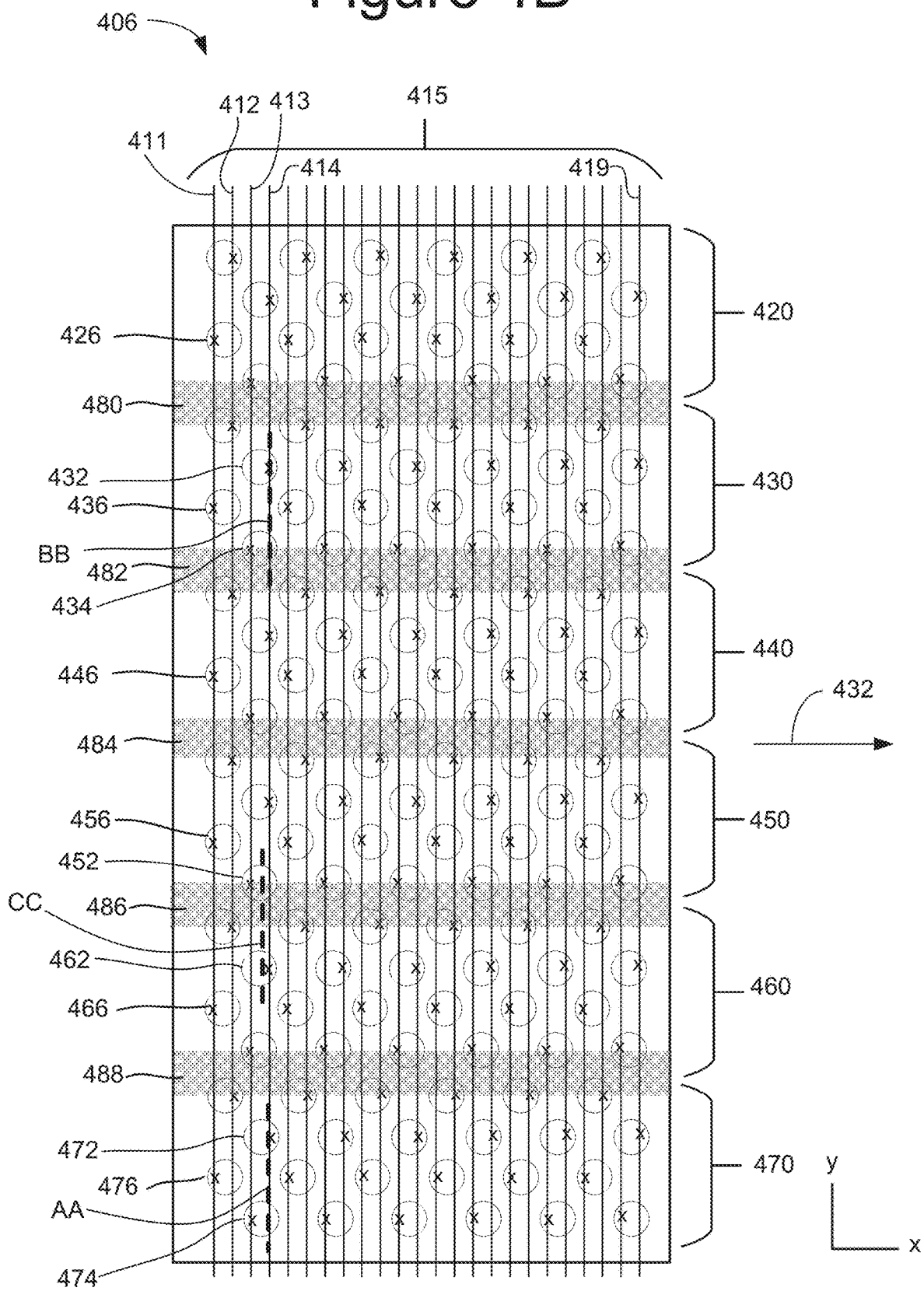
FIG. 4B depicts a top view of a portion of one embodiment of a block of memory cells.

FIGS. 4B-4J depict an example three dimensional ("3D") NAND structure that corresponds to the structure of FIG. 4 and can be used to implement memory structure 202 of FIGS. 2A and 2B. FIG. 4B is a block diagram depicting a top view of a portion 406 of Block 2 of plane 402. As can be seen from FIG. 4B, the block depicted in FIG. 4B extends in the direction of 432. In one embodiment, the memory array has many layers; however, FIG. 4B only shows the top layer.

FIG. 4B depicts a plurality of circles that represent the vertical columns, which correspond to the memory holes. Each of the vertical columns include multiple select transistors (also referred to as a select gate or selection gate) and multiple memory cells. In one embodiment, each vertical column implements a NAND string. For example, FIG. 4B labels a subset of the vertical columns/NAND strings 426, 432, 436, 446, 456, 462, 466, 472, 474 and 476.

FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 411 is connected to vertical columns 426, 436, 446, 456, 466 and 476.

The block depicted in FIG. 4B includes a set of isolation regions 480, 482, 484, 486 and 488, which are formed of SiO$_2$; however, other dielectric materials can also be used. Isolation regions 480, 482, 484, 486 and 488 serve to divide the top layers of the block into six regions; for example, the top layer depicted in FIG. 4B is divided into regions 420, 430, 440, 450, 460 and 470 all of which are referred to as sub-blocks. In one embodiment, the isolation regions only divide the layers used to implement select gates so that NAND strings in different sub-blocks can be independently selected. In one example implementation, a bit line only connects to one vertical column/NAND string in each of regions (sub-blocks) 420, 430, 440, 450, 460 and 470. In that implementation, each block has twenty four rows of active columns and each bit line connects to six rows in each block. In one embodiment, all of the six vertical columns/NAND strings connected to a common bit line are connected to the same word line (or set of word lines); therefore, the system uses the drain side selection lines to choose one (or another subset) of the six to be subjected to a memory operation (program, verify, read, and/or erase).

Although FIG. 4B shows each region 420, 430, 440, 450, 460 and 470 having four rows of vertical columns, six regions and twenty four rows of vertical columns in a block, those exact numbers are an example implementation. Other embodiments may include more or less regions per block, more or less rows of vertical columns per region and more or less rows of vertical columns per block. FIG. 4B also shows the vertical columns being staggered. In other embodiments, different patterns of staggering can be used. In some embodiments, the vertical columns are not staggered.

Figure 4C:
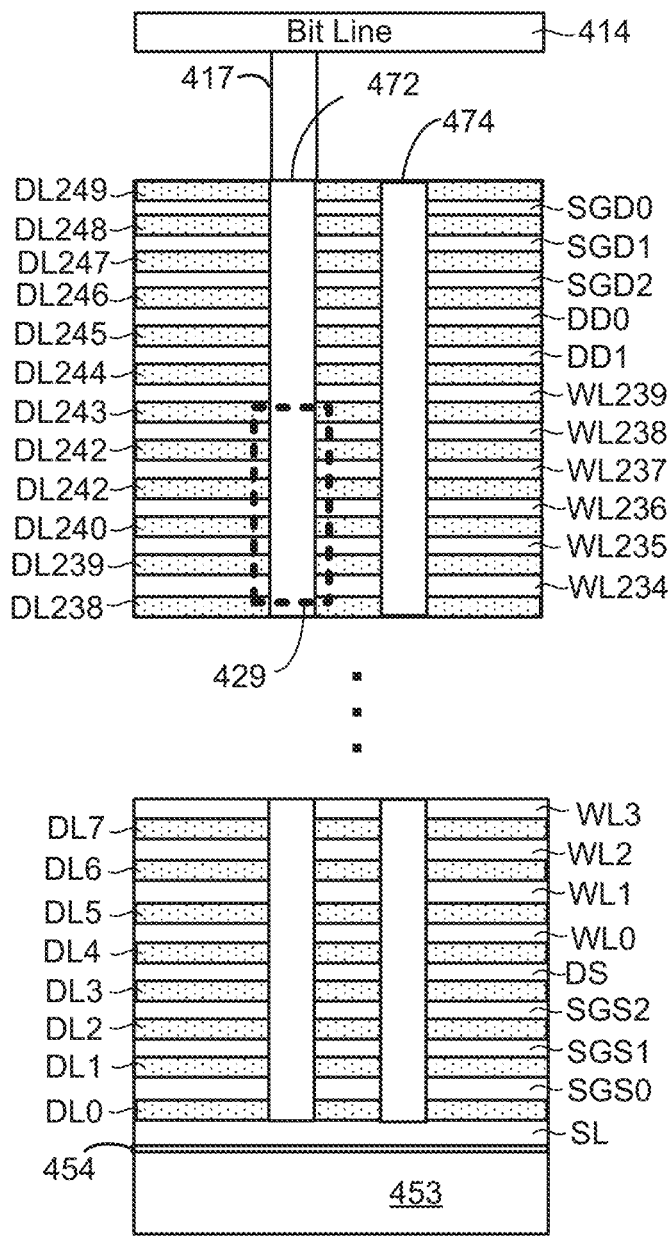
FIG. 4C depicts a cross sectional view of a portion of one embodiment of a block of memory cells.

FIG. 4C depicts a portion of one embodiment of a three dimensional memory structure 202 showing a cross-sectional view along line AA of FIG. 4B. This cross sectional view cuts through vertical columns (NAND strings) 472 and 474 of region 470 (see FIG. 4B). The structure of FIG. 4C includes three drain side select layers SGD0, SGD1 and SGD2; three source side select layers SGS0, SGS1, and SGS2; three dummy word line layers DD0, DD1, and DDS; two hundred and forty word line layers WL0-WL239 for connecting to data memory cells, and two hundred and fifty dielectric layers DL0-DL249. Other embodiments can implement more or less than the numbers described above for FIG. 4C. In one embodiment, SGD0, SGD1 and SGD2 are connected together; and SGDS0, SGS1 and SGS2 are connected together.

Vertical columns 472 and 474 are depicted protruding through the drain side select layers, source side select layers, dummy word line layers and word line layers. In one embodiment, each vertical column comprises a vertical NAND string. Below the vertical columns and the layers listed below is substrate 453, an insulating film 454 on the substrate, and source line SL. The NAND string of vertical column 442 has a source end at a bottom of the stack and a drain end at a top of the stack. As in agreement with FIG. 4B, FIG. 4C show vertical column 442 connected to bit line 414 via connector 417.

For ease of reference, drain side select layers; source side select layers, dummy word line layers and data word line layers collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL249. For example, dielectric layers DL240 is above word line layer WL235 and below word line layer WL236. In one embodiment, the dielectric layers are made from SiO$_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WL0-W239 connect to memory cells (also called data memory cells). Dummy word line layers DD0, DD1 and DS connect to dummy memory cells. A dummy memory cell does not store and is not eligible to store host data (data provided from the host or entity outside of the storage system 100), such as data from a user of the host), while a data memory cell is eligible to store host data. Host data can be contrasted with system data that is generated by memory system 100 (e.g., L2P tables). In some embodiments, data memory cells and dummy memory cells may have a same structure. Drain side select layers SGD0, SGD1, and SGD2 are used to electrically connect and disconnect NAND strings from bit lines. Source side select layers SGS0, SGS1, and SGS2 are used to electrically connect and disconnect NAND strings from the source line SL.

Note that the stack of word lines WL0-WL239 include two edge word lines at the edges of the stack, including top edge word line WL239 and bottom edge word line WL0. Word lines WL1-WL238 are non-edge word lines.

Figure 4D:
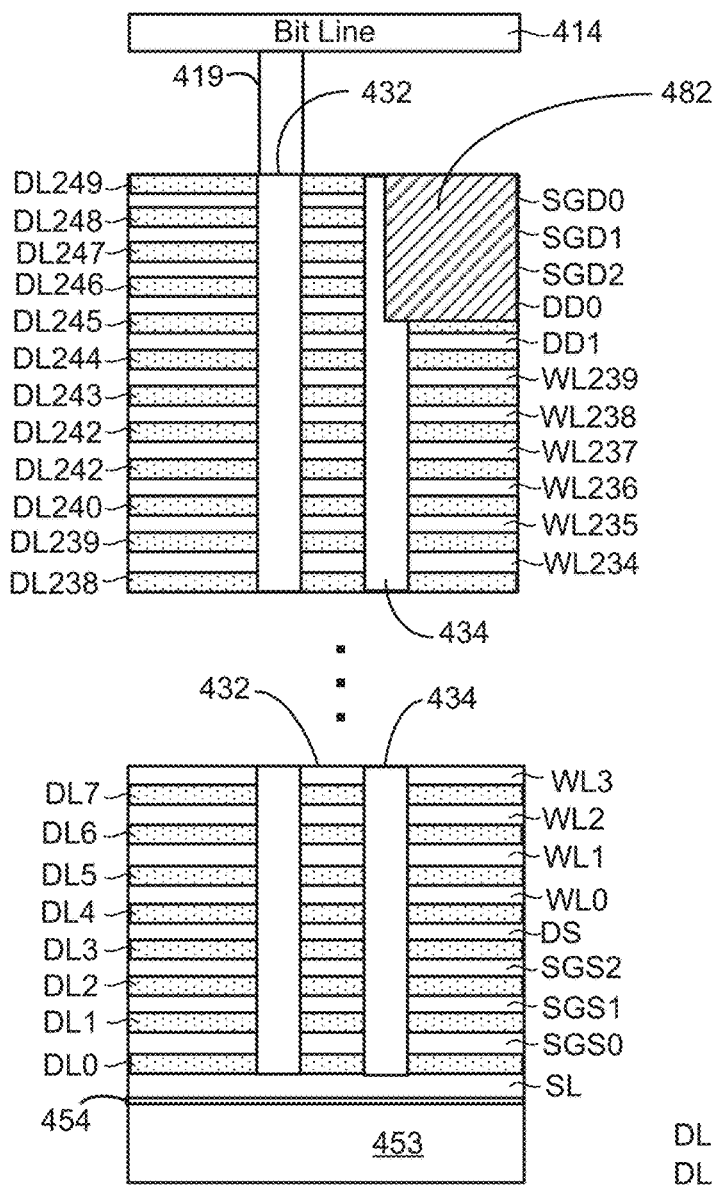
FIG. 4D depicts a cross sectional view of a portion of one embodiment of a block of memory cells.

FIG. 4D depicts a portion of one embodiment of a three dimensional memory structure 202 showing a cross-sectional view along line BB of FIG. 4B. This cross sectional view cuts through vertical columns (NAND strings) 432 and 434 of region 430 (see FIG. 4B). FIG. 4D shows the same alternating conductive and dielectric layers as FIG. 4C. FIG.

4D also shows isolation region 482. Isolation regions 480, 482, 484, 486 and 488) occupy space that would have been used for a portion of the memory holes/vertical columns/NAND stings. For example, isolation region 482 occupies space that would have been used for a portion of vertical column 434. More specifically, a portion (e.g., half the diameter) of vertical column 434 has been removed in layers SDG0, SGD1, SGD2, and DD0 to accommodate isolation region 482. Thus, while most of the vertical column 434 is cylindrical (with a circular cross section), the portion of vertical column 434 in layers SDG0, SGD1, SGD2, and DD0 has a semi-circular cross section. In one embodiment, after the stack of alternating conductive and dielectric layers is formed, the stack is etched to create space for the isolation region and that space is then filled in with $SiO_2$.

Figure 4E:
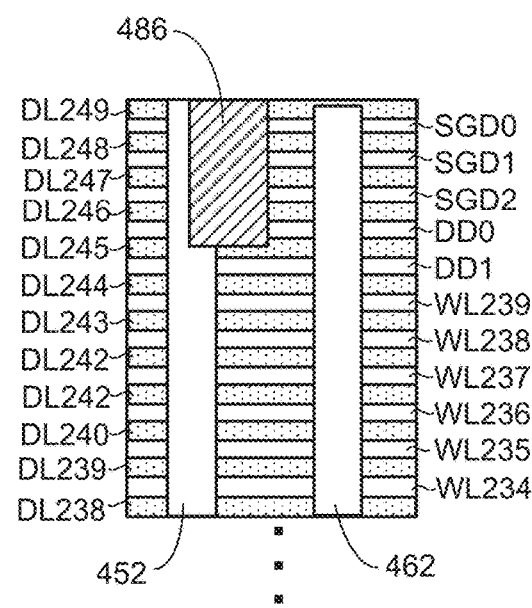
FIG. 4E depicts a cross sectional view of a portion of one embodiment of a block of memory cells.

FIG. 4E depicts a portion of one embodiment of a three dimensional memory structure 202 showing a cross-sectional view along line CC of FIG. 4B. This cross sectional view cuts through vertical columns (NAND strings) 452 and 4624 (see FIG. 4B). FIG. 4E shows the same alternating conductive and dielectric layers as FIG. 4C. FIG. 4E also shows isolation region 486 cutting into vertical columns (NAND string) 452.

Figure 4F:
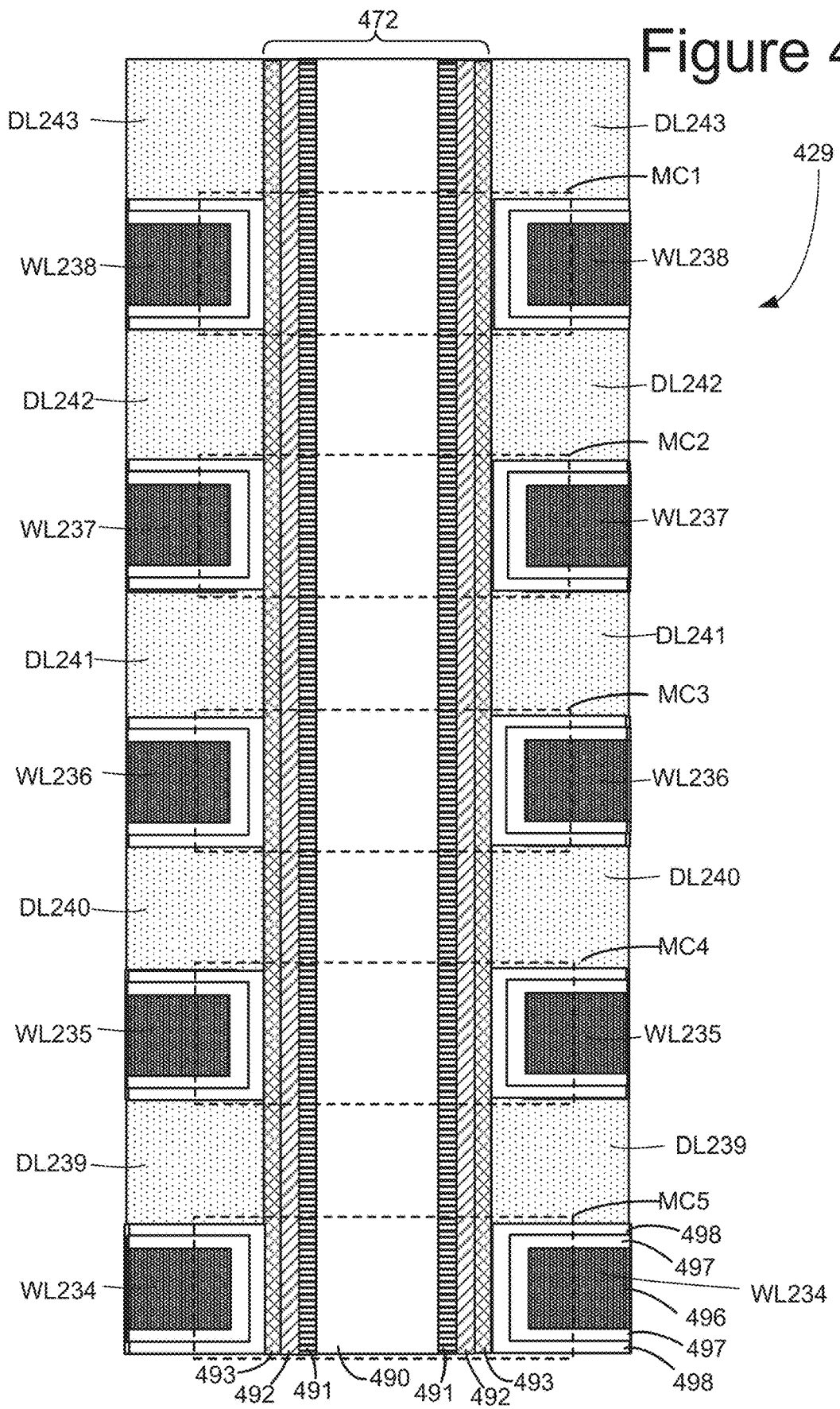
FIG. 4F is a cross sectional view of one embodiment of a vertical column of memory cells.

FIG. 4F depicts a cross sectional view of region 429 of FIG. 4C that includes a portion of vertical column 472. In one embodiment, the vertical columns are round; however, in other embodiments other shapes can be used. In one embodiment, vertical column 472 includes an inner core layer 490 that is made of a dielectric, such as $SiO_2$. Other materials can also be used. Surrounding inner core 490 is polysilicon channel 491. Materials other than polysilicon can also be used. Note that it is the channel 491 that connects to the bit line and the source line. Surrounding channel 491 is a tunneling dielectric 492. In one embodiment, tunneling dielectric 492 has an ONO structure. Surrounding tunneling dielectric 492 is charge trapping layer 493, such as (for example) Silicon Nitride. Other memory materials and structures can also be used. The technology described herein is not limited to any particular material or structure.

FIG. 4F depicts dielectric layers DLL239, DLL240, DLL241, DLL242 and DLL243, as well as word line layers WLL234, WLL235, WLL236, WLL237, and WLL238. Each of the word line layers includes a word line region 496 surrounded by an aluminum oxide layer 497, which is surrounded by a blocking oxide layer 498. In other embodiments, the blocking oxide layer can be a vertical layer parallel and adjacent to charge trapping layer 493. The physical interaction of the word line layers with the vertical column forms the memory cells. Thus, a memory cell, in one embodiment, comprises channel 491, tunneling dielectric 492, charge trapping layer 493, blocking oxide layer 498, aluminum oxide layer 497 and word line region 496. For example, word line layer WLL238 and a portion of vertical column 472 comprise a memory cell MC1. Word line layer WL237 and a portion of vertical column 472 comprise a memory cell MC2. Word line layer WLL236 and a portion of vertical column 472 comprise a memory cell MC3. Word line layer WLL235 and a portion of vertical column 472 comprise a memory cell MC4. Word line layer WLL234 and a portion of vertical column 472 comprise a memory cell MC5. In other architectures, a memory cell may have a different structure; however, the memory cell would still be the storage unit.

When a memory cell is programmed, electrons are stored in a portion of the charge trapping layer 493 which is associated with (e.g. in) the memory cell. These electrons are drawn into the charge trapping layer 493 from the channel 491, through the tunneling dielectric 492, in response to an appropriate voltage on word line region 496. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as GIDL.

Figure 4G:
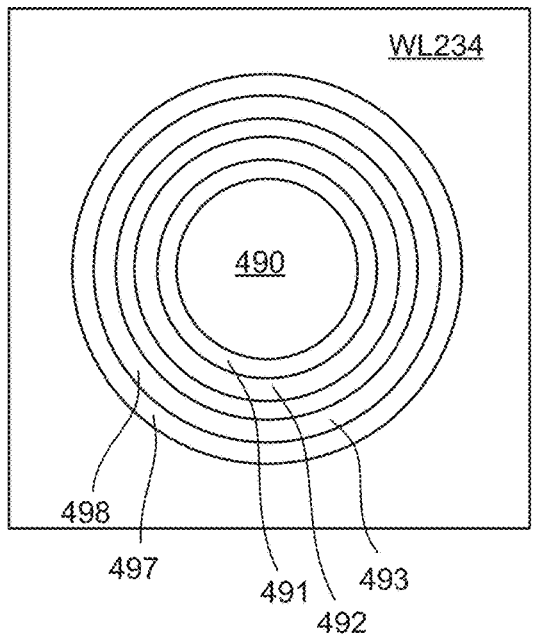
FIG. 4G depicts a cross section of as memory hole that implements a vertical NAND string.

FIG. 4G shows a cross section of vertical column 472 of FIG. 4F, cut through MC5. Thus, FIG. 4G depicts word line layer WL234, inner core 490, channel 491, tunneling dielectric 492, charge trapping layer 493, aluminum oxide layer 497, and blocking oxide layer 498.

Figure 4H:
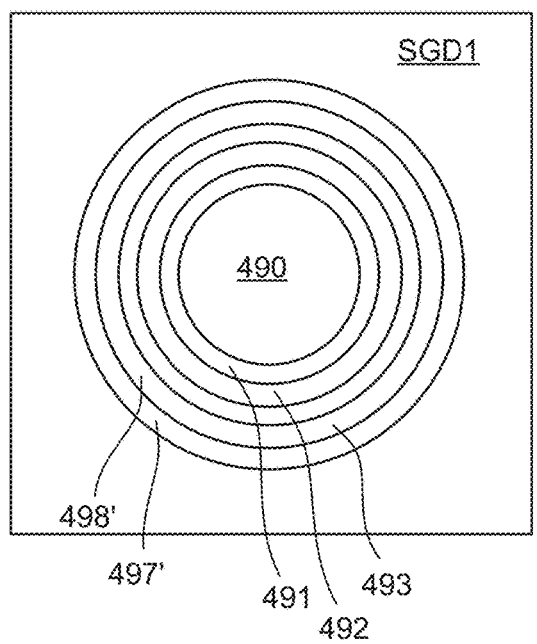
FIG. 4H depicts a cross section of as memory hole that implements a vertical NAND string.

FIG. 4H shows a cross section of vertical column 472 of FIG. 4F, cut through SGD1 (a select gate layer implementing a select gate). Thus, FIG. 4H depicts drain side select line layer SGD1, inner core 490, channel 491, tunneling dielectric 492, charge trapping layer 493, aluminum oxide layer 497, and blocking oxide layer 498.

Figure 4I:
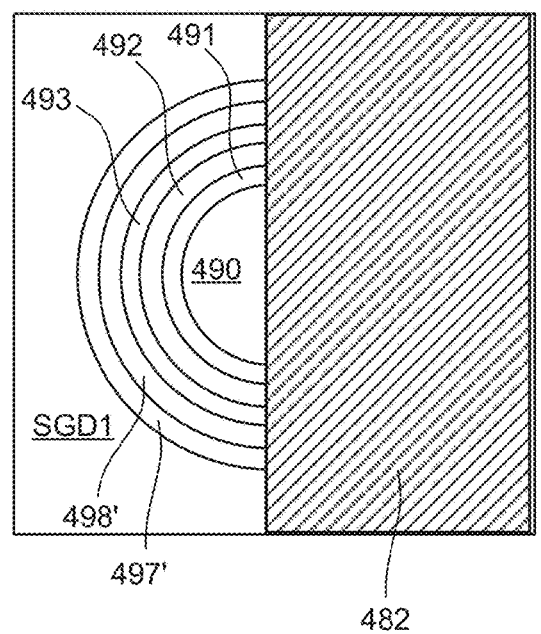
FIG. 4I depicts a cross section of as memory hole that implements a vertical NAND string.

FIG. 4I shows a cross section of vertical column 434 of FIG. 4D, cut through SGD1. Thus, FIG. 4I depicts drain side select line layer SGD1, inner core 490, channel 491, tunneling dielectric 492, charge trapping layer 493, aluminum oxide layer 497, and blocking oxide layer 498. FIG. 4I also shows a portion of isolation region 482. As can be seen in FIG. 4I, the select gate (select gate layer and select line layer) of vertical column 434 is semicircular in shape (or partially circular in shape) due to vertical column (NAND string) 434 intersecting isolation region 482.

Figure 4J:
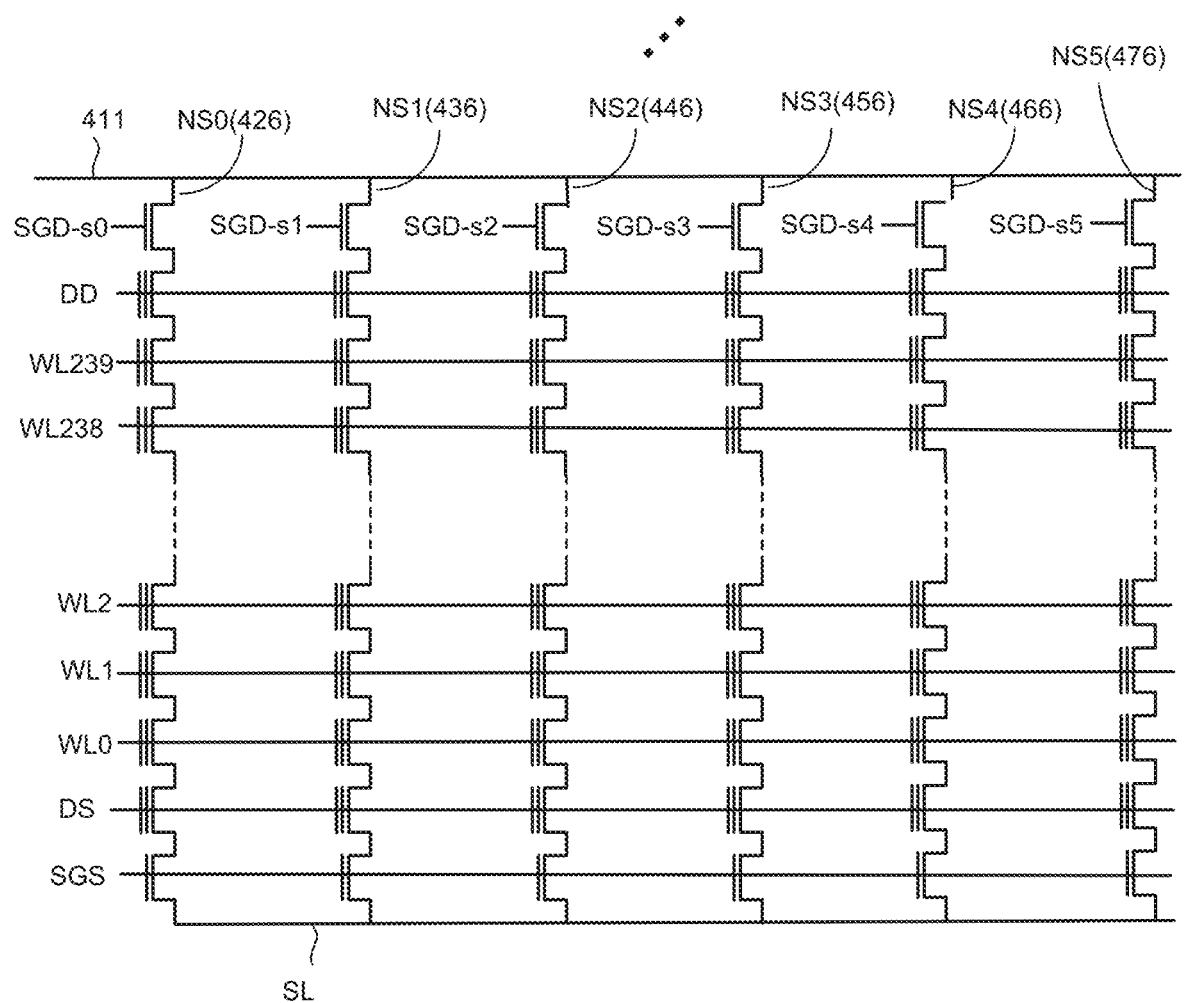
FIG. 4J is a schematic of a plurality of NAND strings in multiple sub-blocks of a same block.

FIG. 4J is a schematic diagram of a portion of the memory array 202 depicted in in FIGS. 4-4I. FIG. 4J shows physical data word lines WL0-WL239 running across the entire block. The structure of FIG. 4J corresponds to a portion 306 in Block 2 of Figure A, including bit line 411. Within the block, in one embodiment, each bit line is connected to six NAND strings. Thus, FIG. 4J shows bit line connected to NAND string NS0 (which corresponds to vertical column 426), NAND string NS1 (which corresponds to vertical column 436), NAND string NS2 (which corresponds to vertical column 446), NAND string NS3 (which corresponds to vertical column 456), NAND string NS4 (which corresponds to vertical column 466), and NAND string NS5 (which corresponds to vertical column 476). As mentioned above, in one embodiment, SGD0, SGD1 and SGD2 are connected together to operate as a single logical select gate for each sub-block separated by isolation regions (480, 482, 484, 486 and 486) to form SGD-s0, SGD-s1, SGD-s2, SGD-s3, SGD-s4, and SGD-s5. SGS0, SG1 and SGS2 are also connected together to operate as a single logical select gate that is represented in FIG. 4E as SGS. Although the select gates SGD-s0, SGD-s1, SGD-s2, SGD-s3, SGD-s4, and SGD-s5 are isolated from each other due to the isolation regions, the data word lines WL0-WL239 of each sub-block are connected together.

The isolation regions (480, 482, 484, 486 and 486) are used to allow for separate control of sub-blocks. A first sub-block corresponds to those vertical NAND strings controlled by SGD-s0. A second sub-block corresponds to those vertical NAND strings controlled by SGD-s1. A third sub-block corresponds to those vertical NAND strings controlled by SGD-s2. A fourth sub-block corresponds to those vertical NAND strings controlled by SGD-s3. A fifth sub-block corresponds to those vertical NAND strings controlled by SGD-s4. A sixth sub-block corresponds to those vertical NAND strings controlled by SGD-s5.

FIG. 4J only shows the NAND strings connected to bit line 411. However, a full schematic of the block would show every bit line and six vertical NAND strings connected to each bit line.

Although the example memories of FIGS. 4-4J are three dimensional memory structure that includes vertical NAND strings with charge-trapping material, other (2D and 3D) memory structures can also be used with the technology described herein.

Figure 5A:
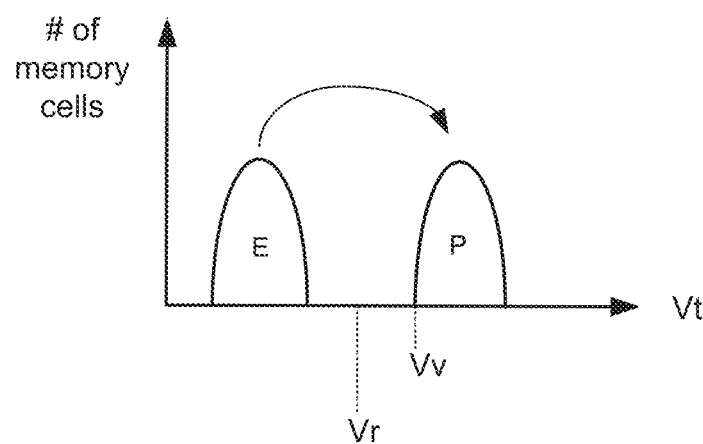
FIG. 5A depicts threshold voltage distributions.

The memory systems discussed above can be erased, programmed and read. At the end of a successful programming process, the threshold voltages of the memory cells should be within one or more distributions of threshold voltages for programmed memory cells or within a distribution of threshold voltages for erased memory cells, as appropriate. FIG. 5A is a graph of threshold voltage versus number of memory cells, and illustrates example threshold voltage distributions for the memory array when each memory cell stores one bit of data per memory cell. Memory cells that store one bit of data per memory cell data are referred to as single level cells ("SLC"). The data stored in SLC memory cells is referred to as SLC data; therefore, SLC data comprises one bit per memory cell. Data stored as one bit per memory cell is SLC data. FIG. 5A shows two threshold voltage distributions: E and P. Threshold voltage distribution E corresponds to an erased data state. Threshold voltage distribution P corresponds to a programmed data state. Memory cells that have threshold voltages in threshold voltage distribution E are, therefore, in the erased data state (e.g., they are erased). Memory cells that have threshold voltages in threshold voltage distribution P are, therefore, in the programmed data state (e.g., they are programmed). In one embodiment, erased memory cells store data "1" and programmed memory cells store data "0." FIG. 5A depicts read compare voltage Vr. By testing (e.g., performing one or more sense operations) whether the threshold voltage of a given memory cell is above or below Vr, the system can determine a memory cells is erased (state E) or programmed (state P). FIG. 5A also depicts verify reference voltage Vv. In some embodiments, when programming memory cells to data state P, the system will test whether those memory cells have a threshold voltage greater than or equal to Vv.

FIGS. 5B-F illustrate example threshold voltage distributions for the memory array when each memory cell stores multiple bit per memory cell data. Memory cells that store multiple bit per memory cell data are referred to as multi-level cells ("MLC"). The data stored in MLC memory cells is referred to as MLC data; therefore, MLC data comprises multiple bits per memory cell. Data stored as multiple bits of data per memory cell is MLC data. In the example embodiment of FIG. 5B, each memory cell stores two bits of data. Other embodiments may use other data capacities per memory cell (e.g., such as three, four, five or six bits of data per memory cell).

Figure 5B:
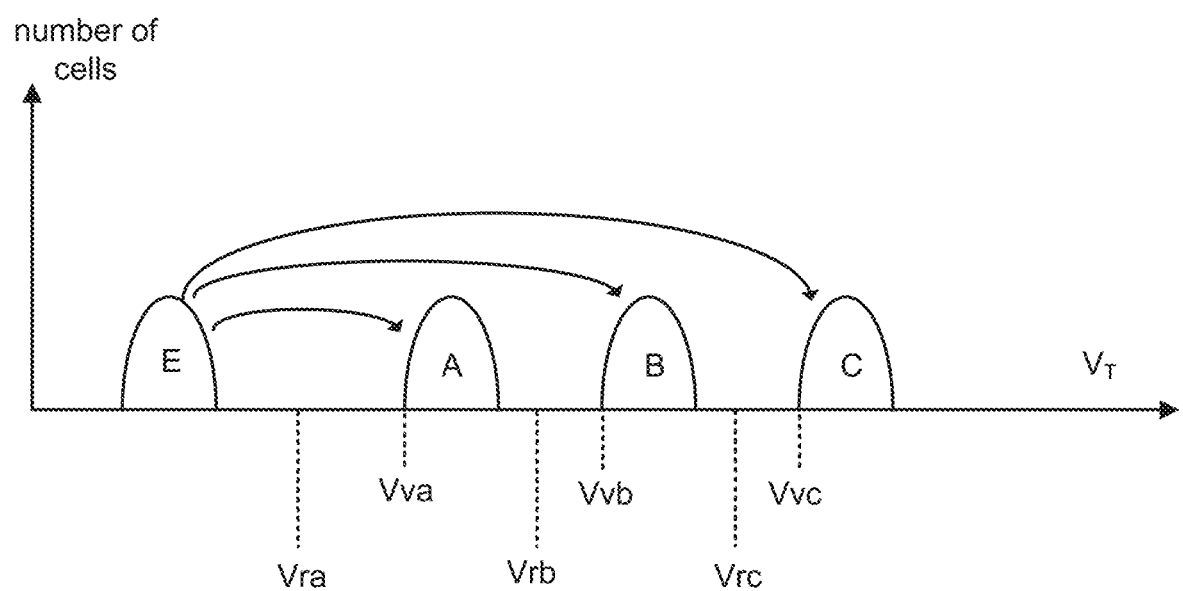
FIG. 5B depicts threshold voltage distributions.

FIG. 5B shows a first threshold voltage distribution E for erased memory cells. Three threshold voltage distributions A, B and C for programmed memory cells are also depicted. In one embodiment, the threshold voltages in the distribution E are negative and the threshold voltages in distributions A, B and C are positive. Each distinct threshold voltage distribution of FIG. 5B corresponds to predetermined values for the set of data bits. In one embodiment, each bit of data of the two bits of data stored in a memory cell are in different logical pages, referred to as a lower page (LP) and an upper page (UP). In other embodiments, all bits of data stored in a memory cell are in a common logical page. The specific relationship between the data programmed into the memory cell and the threshold voltage levels of the cell depends upon the data encoding scheme adopted for the cells. Table 1 provides an example encoding scheme.

TABLE 1

|    | E | A | B | C |
|----|---|---|---|---|
| LP | 1 | 0 | 0 | 1 |
| UP | 1 | 1 | 0 | 0 |

In one embodiment, known as full sequence programming, memory cells can be programmed from the erased data state E directly to any of the programmed data states A, B or C using the process of FIG. 6 (discussed below). For example, a population of memory cells to be programmed may first be erased so that all memory cells in the population are in erased data state E. Then, a programming process is used to program memory cells directly into data states A, B, and/or C. For example, while some memory cells are being programmed from data state E to data state A, other memory cells are being programmed from data state E to data state B and/or from data state E to data state C. The arrows of FIG. 5B represent the full sequence programming. In some embodiments, data states A-C can overlap, with memory controller 120 (or control die 211) relying on error correction to identify the correct data being stored.

FIG. 5C depicts example threshold voltage distributions for memory cells where each memory cell stores three bits of data per memory cells (which is another example of MLC data). FIG. 5C shows eight threshold voltage distributions, corresponding to eight data states. The first threshold voltage distribution (data state) Er represents memory cells that are erased. The other seven threshold voltage distributions (data states) A-G represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected. Table 2 provides an example of an encoding scheme for embodiments in which each bit of data of the three bits of data stored in a memory cell are in different logical pages, referred to as a lower page (LP), middle page (MP) and an upper page (UP).

TABLE 2

|    | Er | A | B | C | D | E | F | G |
|----|----|---|---|---|---|---|---|---|
| UP | 1  | 1 | 1 | 0 | 0 | 0 | 0 | 1 |
| MP | 1  | 1 | 0 | 0 | 1 | 1 | 0 | 0 |
| LP | 1  | 0 | 0 | 0 | 0 | 1 | 1 | 1 |

FIG. 5C shows seven read compare voltages, VrA, VrB, VrC, VrD, VrE, VrF, and VrG for reading data from memory cells. By testing (e.g., performing sense operations) whether the threshold voltage of a given memory cell is above or below the seven read compare voltages, the system can determine what data state (i.e., A, B, C, D, . . . ) a memory cell is in.

FIG. 5C also shows seven verify compare voltages, VvA, VvB, VvC, VvD, VvE, VvF, and VvG. In some embodiments, when programming memory cells to data state A, the system will test whether those memory cells have a threshold voltage greater than or equal to VvA. When programming memory cells to data state B, the system will test whether the memory cells have threshold voltages greater than or equal to VvB. When programming memory cells to data state C, the system will determine whether memory cells have their threshold voltage greater than or equal to VvC. When programming memory cells to data state D, the system will test whether those memory cells have a threshold voltage greater than or equal to VvD. When programming memory cells to data state E, the system will test whether those memory cells have a threshold voltage greater than or equal to VvE. When programming memory cells to data state F, the system will test whether those memory cells have a threshold voltage greater than or equal to VvF. When programming memory cells to data state G, the system will test whether those memory cells have a threshold voltage greater than or equal to VvG. FIG. 5C also shows Vev, which is a voltage level to test whether a memory cell has been properly erased.

In an embodiment that utilizes full sequence programming, memory cells can be programmed from the erased data state Er directly to any of the programmed data states A-G using the process of FIG. 6 (discussed below). For example, a population of memory cells to be programmed may first be erased so that all memory cells in the population are in erased data state Er. Then, a programming process is used to program memory cells directly into data states A, B, C, D, E, F, and/or G. For example, while some memory cells are being programmed from data state ER to data state A, other memory cells are being programmed from data state ER to data state B and/or from data state ER to data state C, and so on. The arrows of FIG. 5C represent the full sequence programming. In some embodiments, data states A-G can overlap, with control die 211 and/or memory controller 120 relying on error correction to identify the correct data being stored. Note that in some embodiments, rather than using full sequence programming, the system can use multi-pass programming processes known in the art.

In general, during verify operations and read operations, the selected word line is connected to a voltage (one example of a reference signal), a level of which is specified for each read operation (e.g., see read compare voltages VrA, VrB, VrC, VrD, VrE, VrF, and VrG, of FIG. 5C) or verify operation (e.g. see verify target voltages VvA, VvB, VvC, VvD, VvE, VvF, and VvG of FIG. 5C) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

Figure 5E:
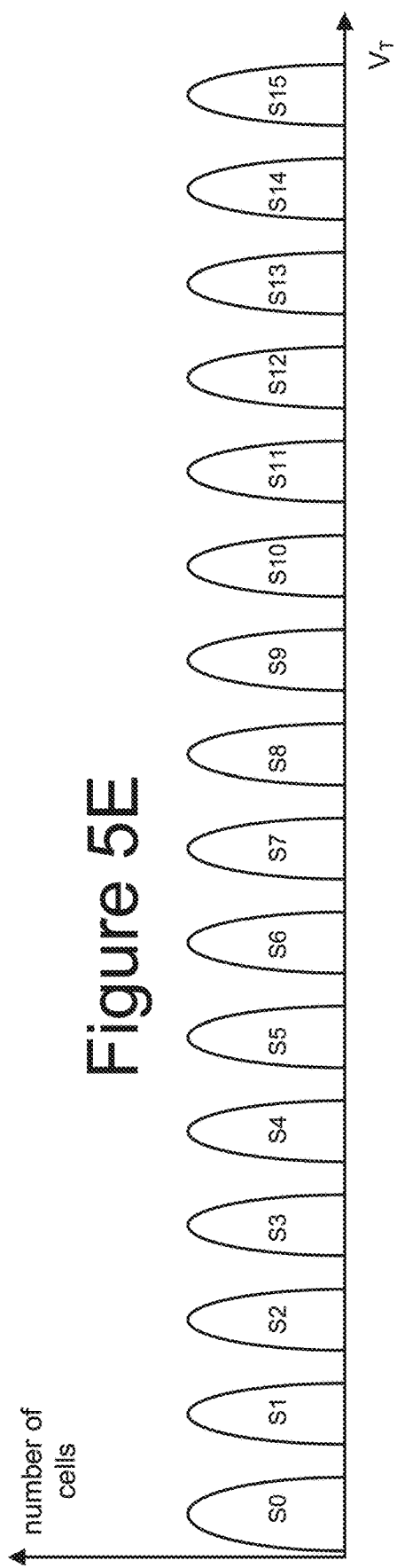
FIG. 5E depicts threshold voltage distributions.

FIG. 5D depicts threshold voltage distributions when each memory cell stores four bits of data, which is another example of MLC data. FIG. 5D depicts that there may be some overlap between the threshold voltage distributions (data states) S0-S15. The overlap may occur due to factors such as memory cells losing charge (and hence dropping in threshold voltage). Program disturb can unintentionally increase the threshold voltage of a memory cell. Likewise, read disturb can unintentionally increase the threshold voltage of a memory cell. Over time, the locations of the threshold voltage distributions may change. Such changes can increase the bit error rate, thereby increasing decoding time or even making decoding impossible. Changing the read compare voltages can help to mitigate such effects. Using ECC during the read process can fix errors and ambiguities. Note that in some embodiments, the threshold voltage distributions for a population of memory cells storing four bits of data per memory cell do not overlap and are separated from each other; for example, as depicted in FIG. 5E. The threshold voltage distributions of FIG. 5D will include read compare voltages and verify compare voltages, as discussed above.

When using four bits per memory cell, the memory can be programmed using the full sequence programming discussed above, or multi-pass programming processes known in the art. Each threshold voltage distribution (data state) of FIG. 5D corresponds to predetermined values for the set of data bits. The specific relationship between the data programmed into the memory cell and the threshold voltage levels of the cell depends upon the data encoding scheme adopted for the cells. Table 3 provides an example of an encoding scheme for embodiments in which each bit of data of the four bits of data stored in a memory cell are in different logical pages, referred to as a lower page (LP), middle page (MP), an upper page (UP) and top page (TP).

TABLE 3

|    | S0 | S1 | S2 | S3 | S4 | S5 | S6 | S7 | S8 | S9 | S10 | S11 | S12 | S13 | S14 | S15 |
|----|----|----|----|----|----|----|----|----|----|----|-----|-----|-----|-----|-----|-----|
| TP | 1  | 1  | 1  | 1  | 1  | 0  | 0  | 0  | 0  | 0  | 1   | 1   | 0   | 0   | 0   | 1   |
| UP | 1  | 1  | 0  | 0  | 0  | 0  | 0  | 0  | 1  | 1  | 1   | 1   | 1   | 1   | 0   | 0   |
| MP | 1  | 1  | 1  | 0  | 0  | 0  | 0  | 1  | 1  | 0  | 0   | 0   | 0   | 1   | 1   | 1   |
| LP | 1  | 0  | 0  | 0  | 1  | 1  | 0  | 0  | 0  | 0  | 0   | 1   | 1   | 1   | 1   | 1   |

Figure 5F:
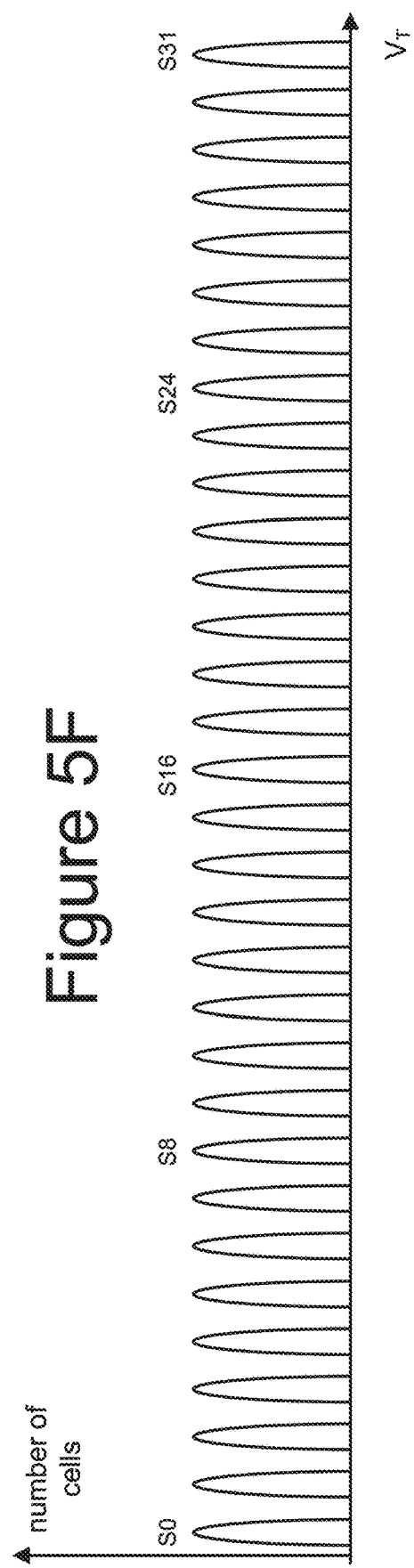
FIG. 5F depicts threshold voltage distributions.

FIG. 5F depicts threshold voltage distributions when each memory cell stores five bits of data, which is another example of MLC data. In one example implementation, when memory cells store five bits of data, the data is stored in any of thirty two data state (e.g., S0-S31).

Figure 6:
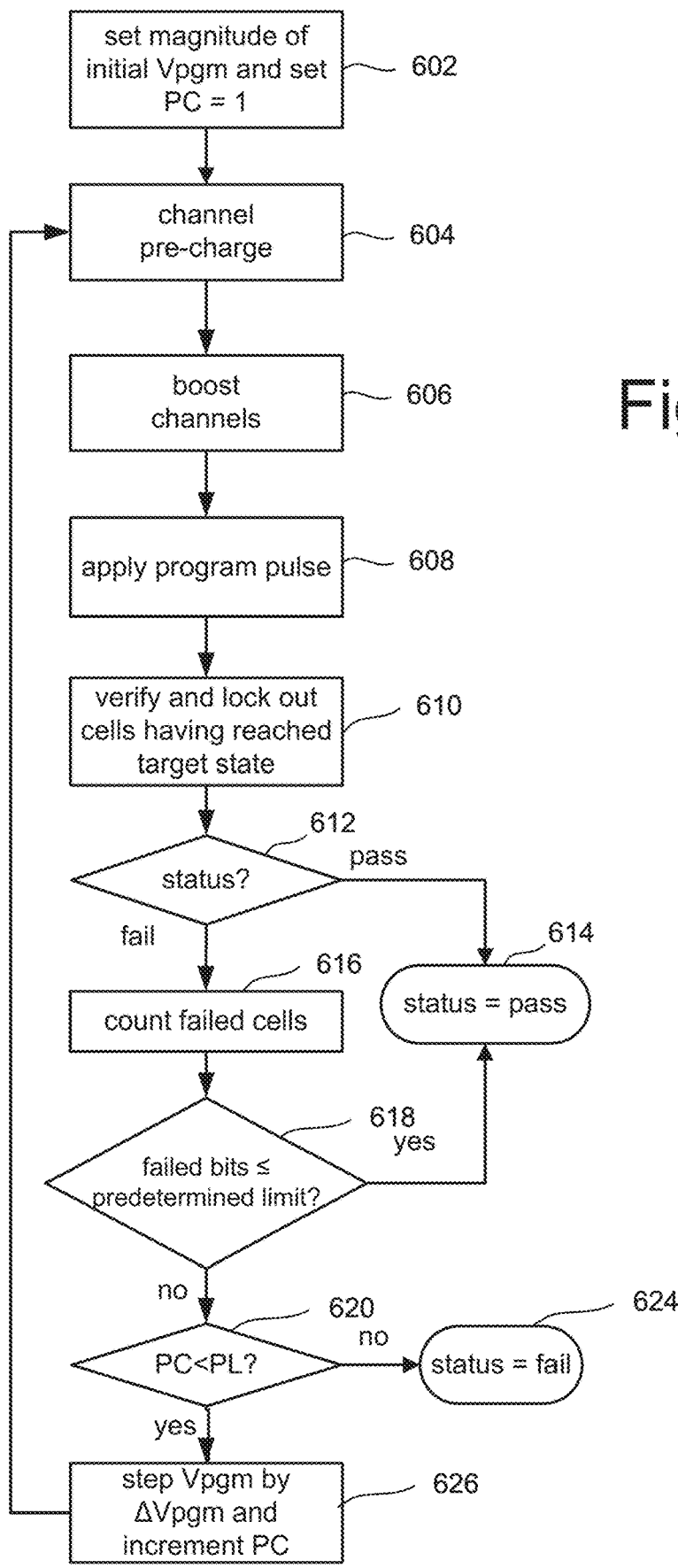
FIG. 6 is a flow chart describing one embodiment of a process for programming non-volatile memory.

FIG. 6 is a flowchart describing one embodiment of a process for programming memory cells. For purposes of this document, the term program and programming are synonymous with write and writing. In one example embodiment, the process of FIG. 6 is performed for memory array 202 using the one or more control circuits (e.g., system control logic 260, column control circuitry 210, row control circuitry 220) discussed above. In one example embodiment, the process of FIG. 6 is performed by integrated memory assembly 207 using the one or more control circuits (e.g., system control logic 260, column control circuitry 210, row control circuitry 220) of control die 211 to program memory cells on memory die 201. The process includes multiple loops, each of which includes a program phase and a verify phase. The process of FIG. 6 is performed to implement the full sequence programming, as well as other programming schemes including multi-pass programming. When implementing multi-pass programming, the process of FIG. 6 is used to implement any/each pass of the multi-pass programming process.

Typically, the program voltage applied to the control gates (via a selected data word line) during a program operation is applied as a series of program pulses (e.g., voltage pulses). Between programming pulses are a set of verify pulses (e.g., voltage pulses) to perform verification. In many implementations, the magnitude of the program pulses is increased with each successive pulse by a predetermined step size. In step 602 of FIG. 6, the programming voltage signal (Vpgm) is initialized to the starting magnitude (e.g., ~12-16V or another suitable level) and a program counter PC maintained by state machine 262 is initialized at 1. In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. Additionally, as memory cells reach their intended target data state, they will be inhibited from further programming. Those NAND strings (e.g., unselected NAND strings) that include memory cells connected to the selected word line that are to be inhibited from programming have their channels boosted to inhibit programming. When a channel has a boosted voltage, the voltage differential between the channel and the word line is not large enough to cause programming. To assist in the boosting, in step 604 the control die will pre-charge channels of NAND strings that include memory cells connected to the selected word line that are to be inhibited from programming. In step 606, NAND strings that include memory cells connected to the selected word line that are to be inhibited from programming have their channels boosted to inhibit programming. Such NAND strings are referred to herein as "unselected NAND strings." In one embodiment, the unselected word lines receive one or more boosting voltages (e.g., ~7-11 volts), also referred to as pass voltages, to perform boosting schemes. A program inhibit voltage is applied to the bit lines coupled the unselected NAND string. In one embodiment, for example, the channel is pre-charged to ~2 volts in step 604 and then floated. In step 606, the channel is boosted up from the 2 volts to a boosting voltage of approximately 8-10 volts.

In step 608, a program voltage pulse of the programming voltage signal Vpgm is applied to the selected word line (the word line selected for programming). If a memory cell on a NAND string should be programmed, then the corresponding bit line is biased at a program enable voltage. In step 608, the program pulse is concurrently applied to all memory cells connected to the selected word line so that all of the memory cells connected to the selected word line are programmed concurrently (unless they are inhibited from programming). That is, they are programmed at the same time or during overlapping times (both of which are considered concurrent). In this manner all of the memory cells connected to the selected word line will concurrently have their threshold voltage change, unless they are inhibited from programming.

In step 610, program verify is performed and memory cells that have reached their target states are locked out from further programming by the control die. Step 610 includes performing verification of programming by sensing at one or more verify compare levels. In one embodiment, the verification process is performed by testing whether the threshold voltages of the memory cells selected for programming have reached the appropriate verify compare voltage. In step 610, a memory cell may be locked out after the memory cell has been verified (by a test of the Vt) that the memory cell has reached its target state.

If, in step 612, it is determined that all of the memory cells have reached their target threshold voltages (pass), the programming process is complete and successful because all selected memory cells were programmed and verified to their target states. A status of "PASS" is reported in step 614. Otherwise, if in step 612, it is determined that not all of the memory cells have reached their target threshold voltages (fail), then the programming process continues to step 616.

In step 616, the number of memory cells that have not yet reached their respective target threshold voltage distribution are counted. That is, the number of memory cells that have, so far, failed to reach their target state are counted. This counting can be done by state machine 262, memory controller 120, or another circuit. In one embodiment, there is one total count, which reflects the total number of memory cells currently being programmed that have failed the last verify step. In another embodiment, separate counts are kept for each data state.

In step 618, it is determined whether the count from step 616 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 614. In this situation, enough memory cells programmed correctly such that the few remaining memory cells that have not been completely programmed can be corrected using ECC during the read process. In some embodiments, the predetermined limit used in step 618 is below the number of bits that can be corrected by error correction codes (ECC) during a read process to allow for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If the number of failed memory cells is not less than the predetermined limit, than the programming process continues at step 620 and the program counter PC is checked against the program limit value (PL). Examples of program limit values include 6, 12, 16, 19, 20 and 30; however, other values can be used. If the program counter PC is not less than the program limit value PL, then the program process is considered to have failed and a status of FAIL is reported in step 624. If the program counter PC is less than the program limit value PL, then the process continues at step 626 during which time the Program Counter PC is incremented by 1 and the programming voltage signal Vpgm is stepped up to the next magnitude. For example, the next pulse will have a magnitude greater than the previous pulse by a step size ΔVpgm (e.g., a step size of 0.1-1.0 volts). After step 626, the process loops back to step 604 and another program pulse is applied to the selected word line (by the control die) so that another iteration (steps 604-626) of the programming process of FIG. 6 is performed.

In some embodiments, memory cells are programmed in an order from the source side to the drain side. For example, first the process of FIG. 6 is performed to program memory cells connected to WL0, followed by using the process of FIG. 6 to program memory cells connected to WL1, followed by using the process of FIG. 6 to program memory cells connected to WL2, followed by using the process of FIG. 6 to program memory cells connected to WL3, . . . followed by using the process of FIG. 6 to program memory cells connected to WL239.

In another embodiment, memory cells are programmed in an order from the drain side to the source side. For example, first the process of FIG. 6 is performed to program memory cells connected to WL239, followed by using the process of FIG. 6 to program memory cells connected to WL238, followed by using the process of FIG. 6 to program memory cells connected to WL237, followed by using the process of FIG. 6 to program memory cells connected to WL236, . . . followed by using the process of FIG. 6 to program memory cells connected to WL1, followed by using the process of FIG. 6 to program memory cells connected to WL0.

In one embodiment memory cells are erased prior to programming, and erasing is the process of changing the threshold voltage of one or more memory cells from a programmed data state to an erased data state. For example, changing the threshold voltage of one or more memory cells from state P to state E of FIG. 5A, from states A/B/C to state E of FIG. 5B, from states A-G to state Er of FIG. 5C or from states S1-S15 to state S0 of FIG. 5D.

One technique to erase memory cells in some memory devices is to bias a p-well (or other types of) substrate to a high voltage to charge up a NAND channel. An erase enable voltage (e.g., a low voltage) is applied to control gates of memory cells while the NAND channel is at a high voltage to erase the non-volatile storage elements (memory cells). Herein, this is referred to as p-well erase.

Another approach to erasing memory cells is to generate gate induced drain leakage (GIDL) current to charge up the NAND string channel. An erase enable voltage is applied to control gates of the memory cells, while maintaining the NAND string channel potential to erase the memory cells. Herein, this is referred to as GIDL erase. Both p-well erase and GIDL erase may be used to lower the threshold voltage (Vt) of memory cells.

In one embodiment, the GIDL current is generated by causing a drain-to-gate voltage at a select transistor (e.g., SGD and/or SGS). A transistor drain-to-gate voltage that generates a GIDL current is referred to herein as a GIDL voltage. The GIDL current may result when the select transistor drain voltage is significantly higher than the select transistor control gate voltage. GIDL current is a result of carrier generation, i.e., electron-hole pair generation due to band-to-band tunneling and/or trap-assisted generation. In one embodiment, GIDL current may result in one type of carriers, e.g., holes, predominantly moving into NAND channel, thereby raising potential of the channel. The other type of carriers, e.g., electrons, are extracted from the channel, in the direction of a bit line or in the direction of a source line, by an electric field. During erase, the holes may tunnel from the channel to a charge storage region of memory cells and recombine with electrons there, to lower the threshold voltage of the memory cells.

The GIDL current may be generated at either end of the NAND string. A first GIDL voltage may be created between two terminals of a select transistor (e.g., drain side select transistor) that is connected to or near a bit line to generate a first GIDL current. A second GIDL voltage may be created between two terminals of a select transistor (e.g., source side select transistor) that is connected to or near a source line to generate a second GIDL current. Erasing based on GIDL current at only one end of the NAND string is referred to as a one-sided GIDL erase. Erasing based on GIDL current at both ends of the NAND string is referred to as a two-sided GIDL erase.

In some non-volatile memory, charge stored in a memory cell may leak over a long period of time after the memory cell is programmed. This is referred to as a data retention issue. As discussed above, the programming of memory cells includes elections moving into charge trapping layer 493 in order to increase the threshold voltage of the respective memory cells so that threshold voltage is within an intended threshold voltage distribution for the appropriate data state (see e.g., FIGS. 5A-5F). Over time (e.g., a very long period of time after programming), however, electrons may leak from charge trapping layer 493 (e.g., back into channel 491 or elsewhere). As more electrons leak out of charge trapping layer 493, the threshold voltage of the memory cell may drift lower. If the threshold voltage of the memory cell drifts too low then when the memory cell is read the system will sense that the memory cell is in the wrong data state. For example, a memory cell in data state C (see FIG. 5C) that experiences too much charge leakage from its charge trapping layer may have its threshold voltage lowered to a magnitude below Vrc; thereby causing a read operation to result in the memory cell being read to be in data state B (which is an error).

Figure 7:
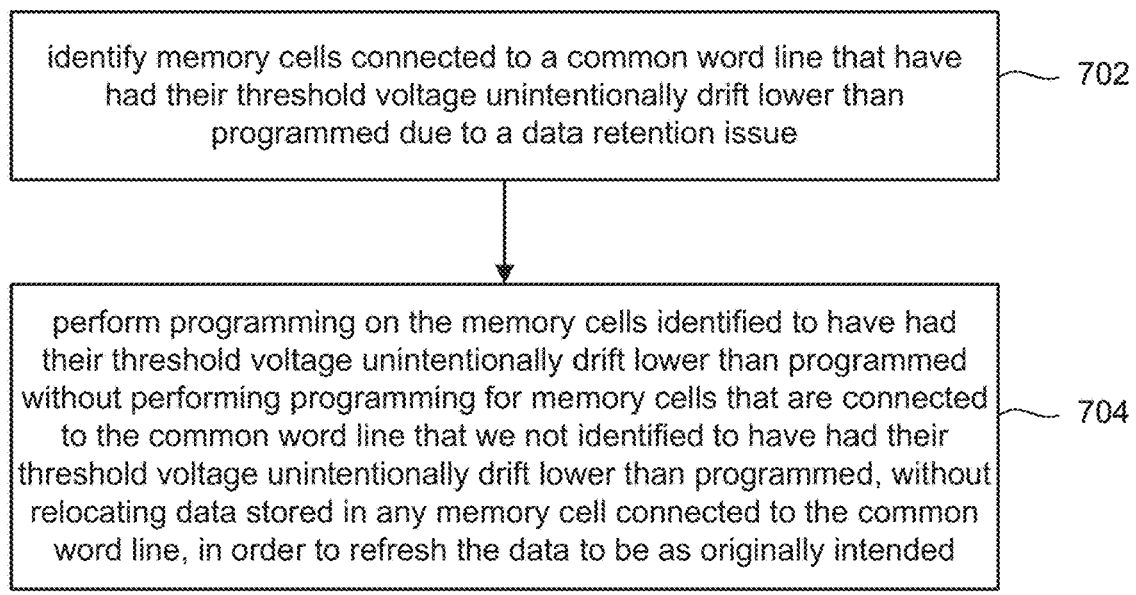
FIG. 7 is a flow chart describing one embodiment of a process for refreshing data.

FIG. 7 is a flow chart describing one embodiment of a process for refreshing data to prevent errors from a data retention issue. In one example embodiment, the process of FIG. 7 is performed by any of the embodiments of a control circuit discussed above. In one example embodiment, the process of FIG. 7 is performed by integrated memory assembly 207 using any of the embodiments of a control circuit discussed above of control die 211 to program memory cells (e.g., NAND strings of memory structure 202) on memory die 201. In one embodiment, the process of FIG. 7 is performed at the direction of state machine 262 (or another processor). The control circuit is connected to the memory cells (e.g., via control lines such as word lines, bit lines, source line and select lines), as described above with respect to FIGS. 1-4J.

In step 702 of FIG. 7, the control circuit identifies memory cells connected to a common word line (e.g., any of WL0-WL239) that have had their threshold voltage unintentionally drift lower than programmed due to a data retention issue. In step 704, the control circuit performs programming on the memory cells identified to have had their threshold voltage unintentionally drift lower than programmed without performing programming for memory cells that are connected to the common word line that were not identified to have had their threshold voltage unintentionally drift lower than programmed. In some embodiments, the refreshing of data proposed herein (including the process of FIG. 7) is performed without relocating data stored in any memory cell connected to the common word line. In some embodiments, the programming of step 704 is performed in order to refresh the data to be as originally intended (e.g., before any charge leakage due to a data retention issue). Some embodiments of step 704 include performing all or a portion of the process of FIG. 6, with memory cells that are connected to the common word line that were not identified to have had their threshold voltage unintentionally drift lower than programmed being locked out from programming (e.g., program inhibit voltage is applied to the bit line).

Figure 8:
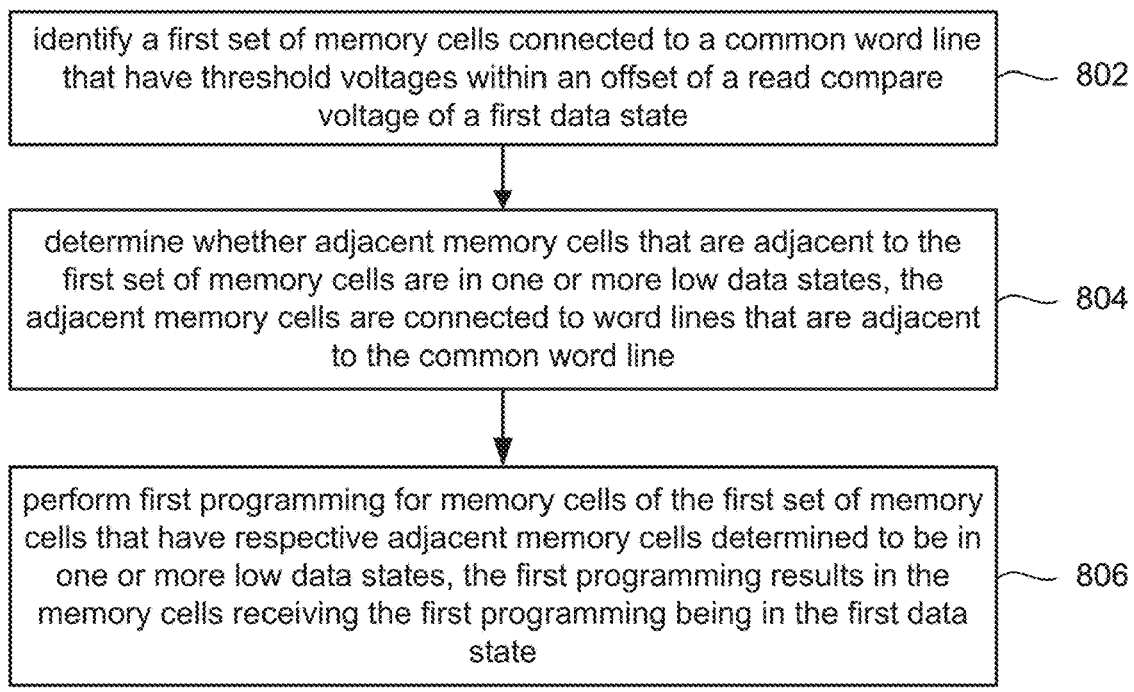
FIG. 8 is a flow chart describing one embodiment of a process for refreshing data.

FIG. 8 is a flow chart describing one embodiment of a process for refreshing data to prevent errors from a data retention issue. In one example embodiment, the process of FIG. 8 is performed by any of the embodiments of a control circuit discussed above. In one example embodiment, the process of FIG. 8 is performed by integrated memory assembly 207 using any of the embodiments of a control circuit discussed above of control die 211 to program memory cells (e.g., NAND strings of memory structure 202) on memory die 201. In one embodiment, the process of FIG. 8 is performed at the direction of state machine 262 (or another processor). The control circuit is connected to the memory cells (e.g., via control lines such as word lines, bit lines, source line and select lines), as described above with respect to FIGS. 1-4J. In one embodiment, the process of FIG. 8 is an example implementation of the process of FIG. 7.

In step 802 of FIG. 8, the control circuit identifies a first set of memory cells connected to a common word line that have threshold voltages within an offset of a read compare voltage of a first data state. The label "first" data state is used only for purposes of identifying a particular data state and it not meant to express any order. In step 804, the control circuit determines whether adjacent memory cells that are adjacent to the first set of memory cells are in one or more low data states. The adjacent memory cells are connected to word lines that are adjacent to the common word line; for example, if the common word line is WL200, then the word lines adjacent to the common word line are WL199 and WL201. Steps 802 and 804 are an example of using two criteria to identify memory cells that have experienced a data retention issue. In one embodiment, steps 802 and 804 are an example implementation of step 702. In step 806 of FIG. 8, the control circuit performs first programming for memory cells of the first set of memory cells that have respective adjacent memory cells determined to be in one or more low data states. That is, memory cells that are connected to the common word line, have threshold voltages within an offset of a read compare voltage of a first data state and have adjacent memory cells in low data states receive some amount of programming. The programming of step 806 results in the memory cells receiving the programming being in the first data state (the data has been refreshed to be as originally intended). Step 806 corresponds to step 704. In summary, step 802 and 804 identify memory cells whose threshold voltage drifted too low due to a data retention issue and step 806 increase the threshold voltage of those memory cells in order to avoid any errors. For example, a memory cell may have been programmed to data state D (see FIG. 5C), but due to charge leakage the threshold voltage of that memory cell is below VrD; therefore, when reading that memory cell there may be an error that causes the control circuit to conclude that the memory cell is in data state C. The process of FIG. 8 first identifies that the memory cell has a data retention issue because its threshold voltage is within an offset of VrD and its adjacent memory cells are in low data states. Having a threshold voltage within an offset of VrD is too low and is already a problem or will be a problem soon. Having a an adjacent memory cell in a low data state indicates that the problem is likely due to a data retention issue rather than neighbor word line interference that occurs when adjacent memory cells are in high data states.

The process of FIG. 8 refers to a "first data state." This first data state can be any data state used for the population of memory cells (See e.g., FIGS. 5A-F). In one embodiment, the process of FIG. 8 is repeated for every data state used for the population of memory cells. For example, first the process of FIG. 8 is performed for data state A, then performed for data state B, then performed for data state C, . . . then performed for data state G.

The process of FIG. 8 refers to a common word line, which can be any word line (e.g., WL0-WL239). In one embodiment, the process of FIG. 8 is repeated for every word line. For example, first the process of FIG. 8 is performed for WL0, then performed for WL1, then performed for WL2, . . . then performed for WL239. The process of FIG. 8 can be performed for an entire block, one sub-block, multiple sub-blocks (together or separately) or all sub-blocks (together or separately).

Step 806 includes performing some amount of programming. Because the programming is not starting from all memory cells being erased, the programming of step 806 can be referred to as soft programming. In one embodiment, step 806 is performed by applying one programming voltage pulse to each of the memory cells identified to receive the programming. In another embodiment, step 806 is performed by applying two, three or four programming voltage pulses to each of the memory cells identified to receive the programming. In another embodiment, step 806 is performed by performing the process of FIG. 6, which includes performing a programming process that applies multiple programming voltage pulses to the common word line and performs verification between programming voltage pulses until the memory cells receiving the first programming are in the first data state.

In one embodiment, the process of FIG. 8 (including steps 802, 804 and 806) is performed without relocating data stored in the memory cells of the first set of memory cells that have respective adjacent memory cells determined to be in one or more low data states. By not relocating data, space is saved in memory array 202, and time is saved not having to perform garbage collection on memory array 202.

Figure 9:
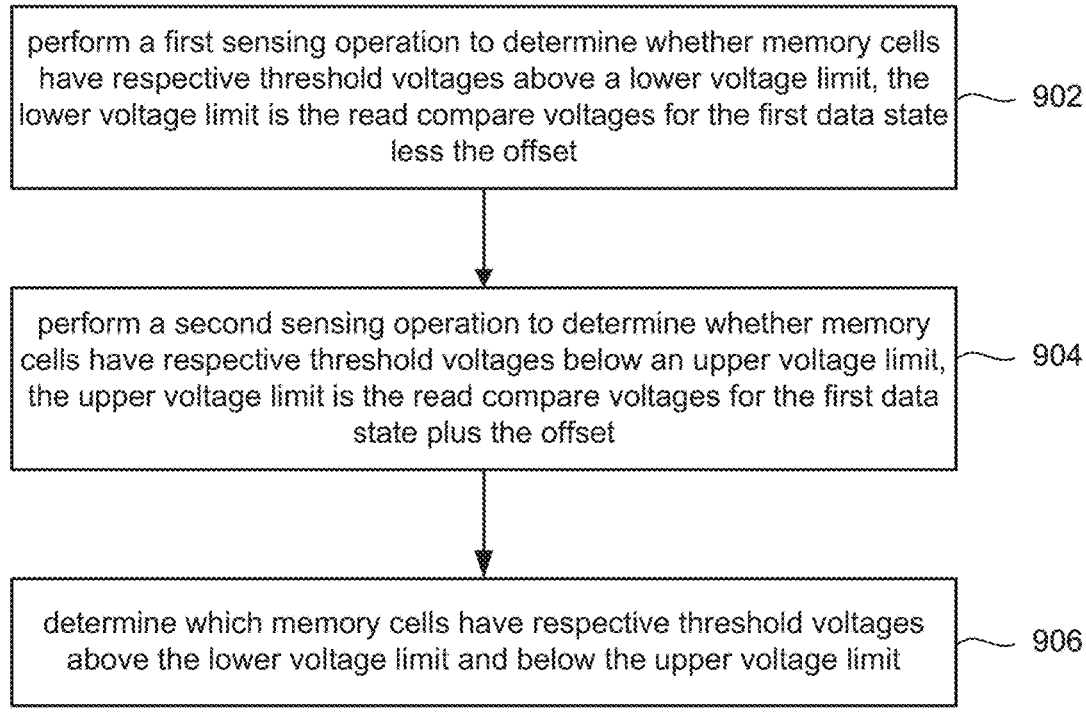
FIG. 9 is a flow chart describing one embodiment of a process for identifying memory cells that need data refreshing.

FIG. 9 is a flow chart describing one embodiment of a process for identifying the first set of memory cells connected to the common word line that have threshold voltages within the offset of the read compare voltage of a data state. Thus, the process of FIG. 9 is an example implementation of step 802 of FIG. 8. In one example embodiment, the process of FIG. 9 is performed by any of the embodiments of a control circuit discussed above. In one example embodiment, the process of FIG. 9 is performed by integrated memory assembly 207 using any of the embodiments of a control circuit discussed above of control die 211 to program memory cells (e.g., NAND strings of memory structure 202) on memory die 201. In one embodiment, the process of FIG. 9 is performed at the direction of state machine 262 (or another processor). The control circuit is connected to the memory cells (e.g., via control lines such as word lines, bit lines, source line and select lines), as described above with respect to FIGS. 1-4J.

Figure 10:
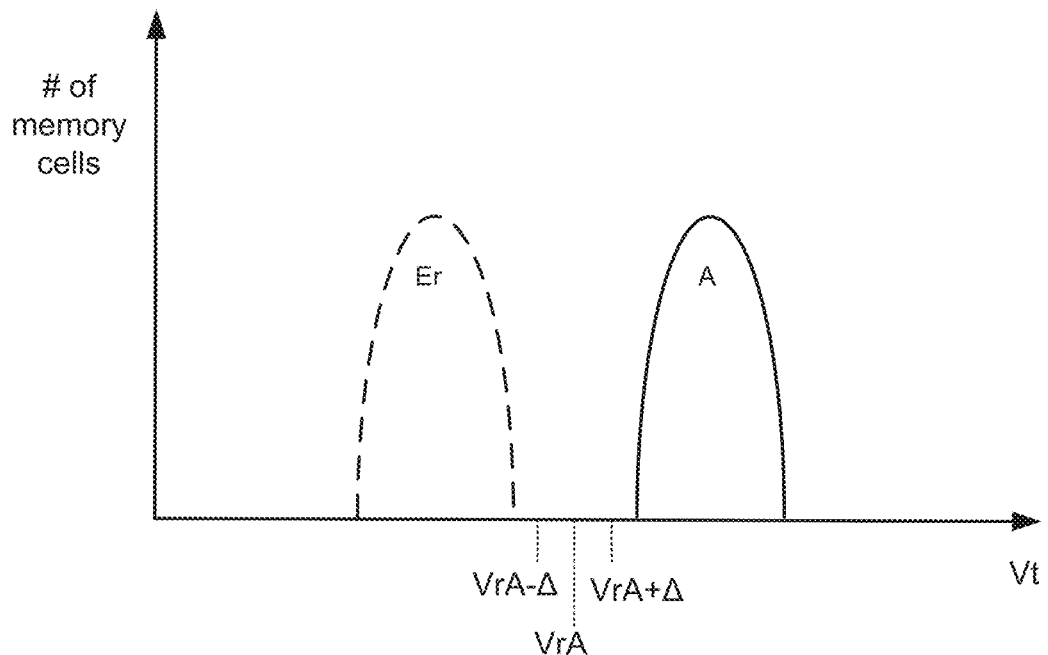
FIG. 10 depicts threshold voltage distributions.

In step 902 of FIG. 9, the control circuit performs a first sensing operation to determine whether memory cells have respective threshold voltages above a lower voltage limit. In one embodiment, the lower voltage limit is the read compare voltage for the data state less the offset. For example, FIG. 10 shows data state Er and data state A of FIG. 5C for memory cells storing three bits of data per memory cell. The technology disclosed herein applies to memory cells storing more or less than three bits of data per memory cell; however, FIG. 5C is being used as an example of teaching purposes. Note that state A is the programmed state having lowest threshold voltages of the programmed data states as states B-G have higher threshold voltages and state Er is the erased data state. FIG. 10 shows read compare voltage VrA between data states Er and A. FIG. 10 also shows an example of an offset Δ. The lower voltage limit depicted in FIG. 10, which is the read compare voltage for the data state less the offset, is depicted as VrA−Δ. Thus, one embodiment of step 902 includes testing whether the threshold voltage of the memory cells are greater than VrA−Δ. In one example implementation, step 902 is performed by applying a voltage to the common word line (connected to the gates of the memory cells) having a magnitude equal to VrA−Δ and sensing whether the memory cells turn on (conduct current) or remain off (do not conduct current), or an equivalent. If a memory cell turns on in response to a gate voltage of VrA−Δ, then the memory cell has a threshold voltage less than VrA−Δ. If a memory cell does not turn on in response to a gate voltage of VrA−Δ, then the memory cell has a threshold voltage greater than VrA−Δ. In one embodiment, Δ=01.volts, and there is a 0.8 volt separation between peaks of the threshold voltage distributions of the data states. In other embodiments, Δ can be other magnitudes (e.g., 0.2 v, 0.3 v, or other values).

In step 904 of FIG. 9, the control circuit performs a second sensing operation to determine whether memory cells have respective threshold voltages below an upper voltage limit. On one embodiment, the upper voltage limit is the read compare voltages for the data state plus the offset. The upper voltage limit depicted in FIG. 10, which is the read compare voltage for the data state plus the offset, is depicted as VrA+Δ. Thus, one embodiment of step 904 includes testing whether the threshold voltage of the memory cells are greater than VrA+Δ. In one example implementation, step 904 is performed by applying a voltage to the common word line (connected to the gates of the memory cells) having a magnitude equal to VrA+Δ and sensing whether the memory cells turn on (conduct current) or remain off (do not conduct current), or an equivalent. If a memory cell turns on in response to a gate voltage of VrA+Δ, then the memory cell has a threshold voltage less than VrA+Δ. If a memory cell does not turn on in response to a gate voltage of VrA+Δ, then the memory cell has a threshold voltage greater than VrA+Δ.

In step 906 of FIG. 9, the control circuit determines which memory cells have respective threshold voltages above the lower voltage limit and below the upper voltage limit. In one example, step 906 is performed by determining which memory cells turned on in response to VrA+Δ in step 904 but did not turn on in response t0 VrA−Δ.

Figure 11:
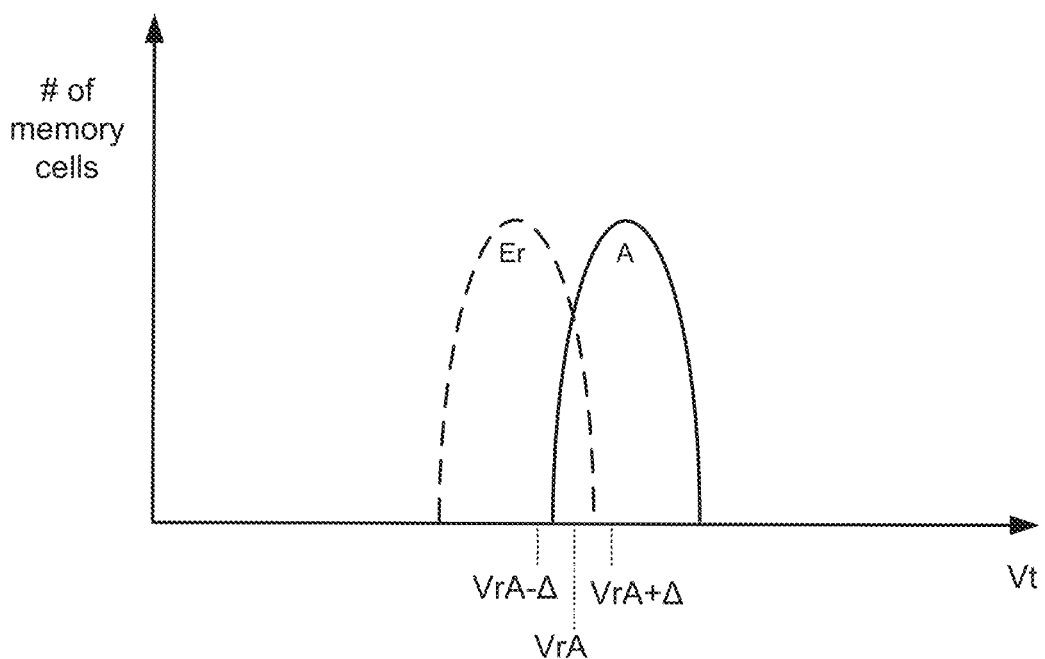
FIG. 11 depicts threshold voltage distributions.

In the example of FIG. 10, data states Er and A are separated rather than be overlapping. In other embodiments, the data states are overlapping. For example, FIG. 11 shows data states Er and A overlapping. FIG. 11 also shows the read compare voltage VrA, the lower voltage limit VrA−Δ, and the upper voltage limit VrA+Δ. The discussion above with respect to steps 902-906 also applies to the overlapping data states of FIG. 11.

FIG. 12 is a flow chart describing one embodiment of a process for determining whether adjacent memory cells that are adjacent to the first set of memory cells are in one or more low data states. Thus, the process of FIG. 12 is an example implementation of step 804 of FIG. 8. In one example embodiment, the process of FIG. 12 is performed by any of the embodiments of a control circuit discussed above. In one example embodiment, the process of FIG. 12 is performed by integrated memory assembly 207 using any of the embodiments of a control circuit discussed above of control die 211 to program memory cells (e.g., NAND strings of memory structure 202) on memory die 201. In one embodiment, the process of FIG. 12 is performed at the direction of state machine 262 (or another processor). The control circuit is connected to the memory cells (e.g., via control lines such as word lines, bit lines, source line and select lines), as described above with respect to FIGS. 1-4J.

In step 1202 of FIG. 12, the control circuit performs a read process for memory cells connected to the first adjacent word line. FIG. 12 describes a process for determining whether the adjacent memory cells are in one or more low data states. The adjacent memory cells are on adjacent word lines. For example, if the selected word line WLn (also referred to in the other drawings as the common word line) is WL155, then the two adjacent word lines are WL154 (ie first adjacent word line) and WL156 (ie second adjacent word line). The read process performed in step 1202 includes testing (e.g., performing sense operations) whether the threshold voltage of the memory cell are above or below the read compare voltages (e.g., VrA, VrB, VrC, VrD, VrE, VrF, and VrG), so that the system can determine what data state (i.e., A, B, C, D, . . . ) the memory cells are in. The results of the read process of step 1202 are stored during step 1204. In step 1206, the control circuit performs a read process for memory cells connected to the second adjacent word line and stores the results during step 1208.

In step 1210, for each memory cell connected to the common word line (WLn) that has a threshold voltage within the offset of the read compare voltage of a first data state (e.g., are in first set of memory cells of FIG. 8), the control circuit determines whether the adjacent memory cell on WLn−1 and whether the adjacent memory cell on WLn+1 are in low data states. That is, for each memory cell found have a threshold voltage within the offset of the read compare voltage of the data state, the control circuit accesses the results of the read process of step 1202 to determine if a first adjacent memory cell is in a low data state and the control circuit accesses the results of the read process of step 1206 to determine if a second adjacent memory cell is in a low data state. If, for a given memory cell connected to the common word line and having a threshold voltage within the offset of the read compare voltage of the data state, both adjacent memory cells are in a low data state, then the given memory cell will have its data refreshed.

The low data states are the data states with the lowest threshold voltages. For example, in one embodiment, the low data states are the two data states with the lowest threshold voltages (e.g., Er and A). In another embodiment the low data states are the three data states with the lowest threshold voltages (e.g., Er, A and B for 3 bits per memory cell). In another embodiment the low data states are the four data states with the lowest threshold voltages (e.g., S0, S1, S2 and S3 for 4 bits per memory cell). In another embodiment the low data states include up to 40% of all data states. Other amounts of data states and/or groupings can also be used.

Figure 13:
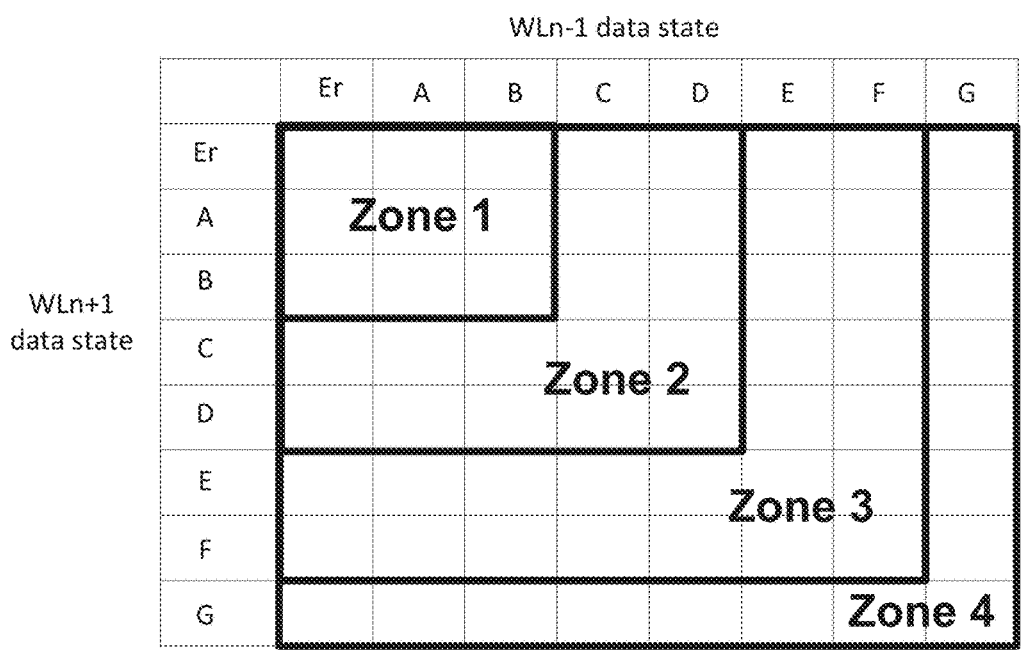
FIG. 13 is a chart that depicts one example embodiment for dividing the data states into zones, using the example of FIG. 5C and three bits per memory cell.

FIG. 13 is a chart that depicts one example embodiment for dividing the data states into zones, using the example of FIG. 5C and three bits per memory cell. The concepts taught by FIG. 13 and explained below can also be used for more or less than three bits per memory cell. Each column and row of the chart depicted in FIG. 13 are labeled with a data state. The columns represent the data state for the first adjacent memory cell that is connected to WLn−1 (e.g., read in step 1202). The rows represent the data state for the second adjacent memory cell that is connected to WLn+1 (e.g., read in step 1206). FIG. 13 shows that if the adjacent memory cell on WLn−1 and the adjacent memory cell on WLn+1 are both in any of data states Er, A and B, then the corresponding memory cell on WLn is on Zone 1; if the adjacent memory cell on WLn−1 is in any of data states C and D and the adjacent memory cell on WLn+1 is in any of data states Er-D, or if the adjacent memory cell on WLn+1 is in any of data states C and D and the adjacent memory cell on WLn−1 is in any of data states Er-D, then the corresponding memory cell on WLn is on Zone 2; etc. In one embodiment, the adjacent memory cells are in low data states if they are both in Zone 1. In another embodiment, the adjacent memory cells are in low data states if they are both in Zone 1 or Zone 2.

In one embodiment, the control circuit is configured to perform the first programming (see step 806) by applying different magnitudes of programming based on which zones adjacent memory cells are in. Amounts of programming may be used for memory cells in Zone 1>Zone 2>Zone 3.

Figure 14:
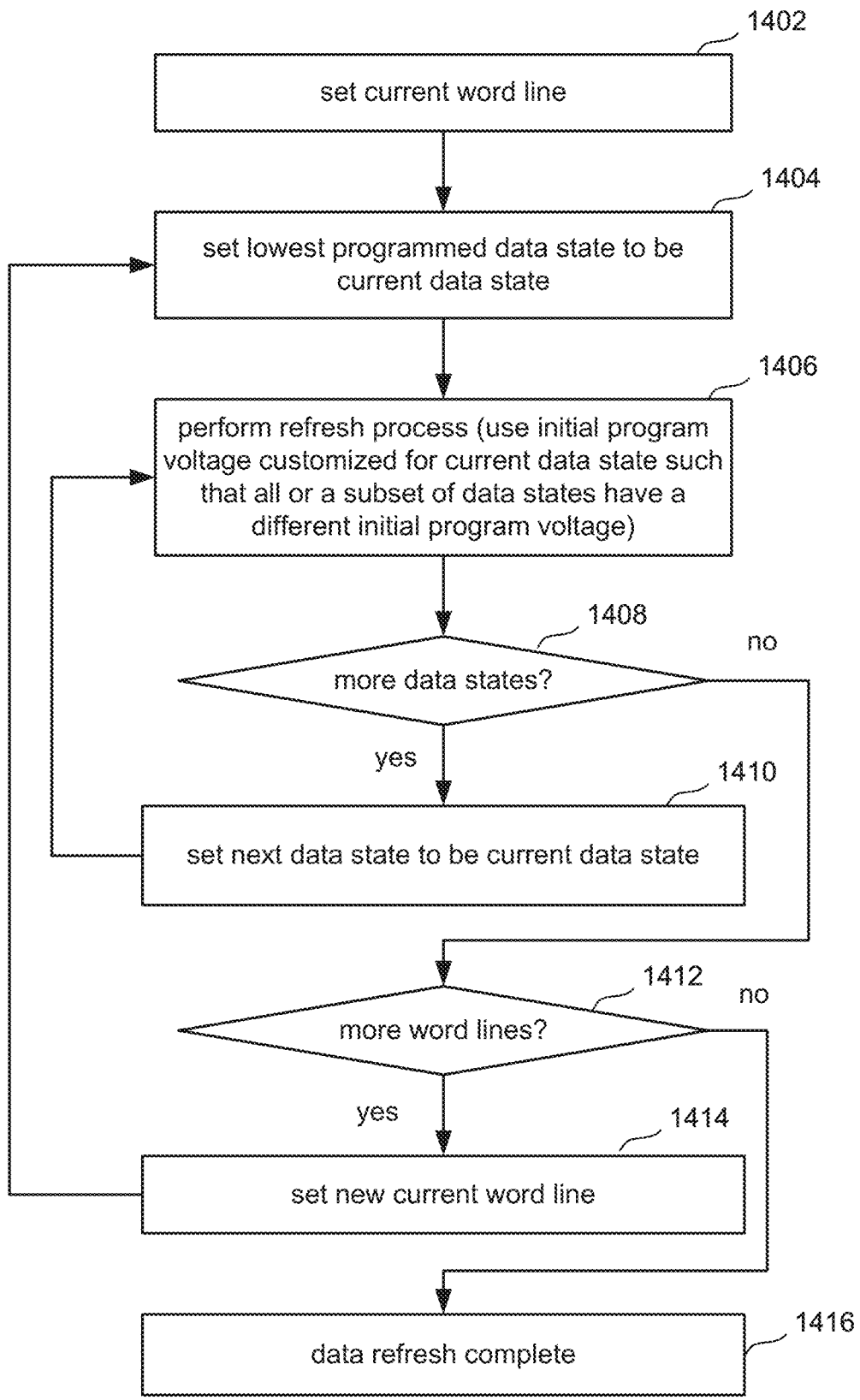
FIG. 14 is a flow chart describing one embodiment of a process for refreshing data.

FIG. 14 is a flow chart describing one embodiment of a process for refreshing data for memory cells that can be in any of multiple data states and can be on multiple word lines. The process of FIG. 14 is performed by any of the embodiments of a control circuit discussed above. In one example embodiment, the process of FIG. 14 is performed by integrated memory assembly 207 using any of the embodiments of a control circuit discussed above of control die 211 to program memory cells (e.g., NAND strings of memory structure 202) on memory die 201. In one embodiment, the process of FIG. 14 is performed at the direction of state machine 262 (or another processor). The control circuit is connected to the memory cells (e.g., via control lines such as word lines, bit lines, source line and select lines), as described above with respect to FIGS. 1-4J.

In step 1402, the current word line is set for processing. For example, if data needs to be refreshed on word lines WL10-WL15, then in step 1402 the word line WL10 is set as the current word line. In step 1404, the current data state is set for processing to be the lowest programmed data state (e.g., data state A of FIG. 5C, data state S1 of FIG. 5D). In step 1406, the control circuit performs a refresh process, for example, by performing the processes of FIGS. 7 and/or 8. If there are more data states to process (step 1408), then the next data state becomes the current data state and the process loops back to step 1406 to use the process of FIGS. 7 and/or 8 to perform the refresh for the next data state. For example, if the first loop of steps 1406-1410 work on data state A, then the next loop of steps 1406-1410 work on data state B, etc. When all data states are processed (e.g., after processing data state G), then the process continues from step 1408 to step 1412 to determine if more word lines need to be processed. The data that needs to be processed may have been on one word line or many word lines. If there are more word lines to refresh, then the next word line becomes the current word line (step 1414) for process of FIG. 14 continues at step 1404. After all word lines that need to be refreshed are refreshed (see step 1412), then the data refresh is complete (step 1416).

For memory cells on the same word line, FIG. 14 shows how the refresh is performed for multiple data states. For example, first the refresh of FIGS. 7 and/or 8 is used to refresh for data state A, then the refresh of FIGS. 7 and/or 8 is used to refresh for data state B, then the refresh of FIGS. 7 and/or 8 is used to refresh for data state C, then the refresh of FIGS. 7 and/or 8 is used to refresh for data state D, then the refresh of FIGS. 7 and/or 8 is used to refresh for data state E, then the refresh of FIGS. 7 and/or 8 is used to refresh for data state F, and then the refresh of FIGS. 7 and/or 8 is used to refresh for data state G. Thus, in addition to identifying the first set of memory cells for the first state (see FIG. 8), when the process of FIG. 8 is performed multiple times as per FIG. 14 then the control circuit is configured to identify a second set of memory cells connected to the common word line that have threshold voltages within an offset of a read compare voltage of a second data state and a third set of memory cells connected to the common word line that have threshold voltages within an offset of a read compare voltage of a third data state; determine whether adjacent memory cells that are adjacent to the second set of memory cells are in one or more low data states and whether adjacent memory cells that are adjacent to the third set of memory cells are in one or more low data states; perform second programming for memory cells of the second set of memory cells that have respective adjacent memory cells determined to be in one or more low data states, the second programming results in the memory cells receiving the second programming being in the second data state; and perform third programming for memory cells of the third set of memory cells that have respective adjacent memory cells determined to be in one or more low data states, the third programming results in the memory cells receiving the third programming being in the third data state. In some implementations, the first programming is performed at a different time than the second programming and the third programming; the second programming is performed at a different time than the third programming; the first programming includes applying a programming signal starting at a first voltage magnitude; the second programming includes applying a programming signal starting at a second voltage magnitude, the second magnitude is greater than the first magnitude; and the third programming includes applying a programming signal starting at a third voltage magnitude, the third magnitude is greater than the second magnitude. For example, the control circuit can use different initial program voltages customized for current data state such that all or a subset of data states have a different initial program voltage (see FIG. 6).

Figure 15:
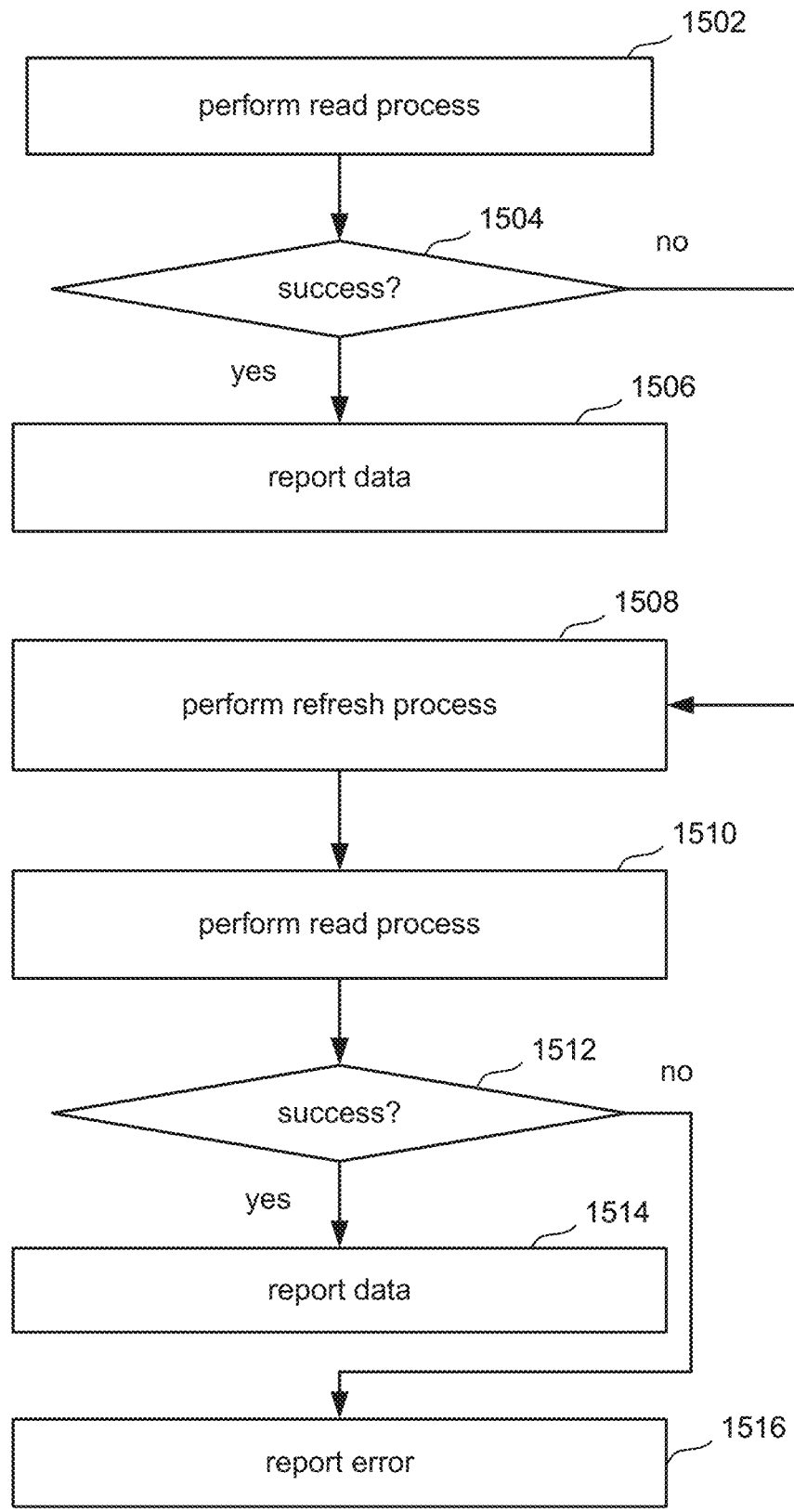
FIG. 15 is a flow chart describing one embodiment of a process for reading and refreshing data.

FIGS. 15-17 provide examples of using the refresh technology discussed above. FIG. 15 is a flow chart describing one embodiment of a process for reading and refreshing data. The process of FIG. 15 is performed by any of the embodiments of a control circuit discussed above. In one example embodiment, the process of FIG. 15 is performed by integrated memory assembly 207 using any of the embodiments of a control circuit discussed above of control die 211 to program memory cells (e.g., NAND strings of memory structure 202) on memory die 201. In one embodiment, the process of FIG. 15 is performed at the direction of state machine 262 (or another processor). The control circuit is connected to the memory cells (e.g., via control lines such as word lines, bit lines, source line and select lines), as described above with respect to FIGS. 1-4J.

In step 1502, the control circuit performs a read process. This can be any read process known in the art. For example, the control circuit can read the data stored in all memory cells that are connected to a word line or all memory cells that are connected to a word line and are in a same sub-block. If the read process was successful (step 1504), then the data is reported in step 1506 (e.g., data is reported to the host). If the read process was not successful (step 1504), then the control circuit performs a refresh process in step 1508. For example, in response to the read process failing the control circuit performs the refresh process of FIGS. 7, 8 and/or 14. After performing the refresh process in step 1508 (which should have remedied data retention issues), the control circuit performs another read process in step 1510. If the read process of step 1510 was successful (step 1512). then the data is reported in step 1514 (e.g., data is reported to the host). If the read process of step 1510 was not successful (step 1512), the control circuit reports an error (e.g., reports the error to the host).

FIG. 16 is a flow chart describing one embodiment of a process for reading and refreshing data. The process of FIG. 16 is performed by any of the embodiments of a control circuit discussed above. In one example embodiment, the process of FIG. 16 is performed by integrated memory assembly 207 using any of the embodiments of a control circuit discussed above of control die 211 to program memory cells (e.g., NAND strings of memory structure 202) on memory die 201. In one embodiment, the process of FIG. 16 is performed at the direction of state machine 262 (or another processor). The control circuit is connected to the memory cells (e.g., via control lines such as word lines, bit lines, source line and select lines), as described above with respect to FIGS. 1-4J.

In step 1602, the control circuit successfully performs a read process. This can be any read process known in the art. For example, the control circuit can read the data stored in all memory cells that are connected to a word line or all memory cells that are connected to a word line and are in a same sub-block. In step 1604, the data read is reported. For example, the control circuit can report the data read to the host. In order to prevent errors in data stored in the memory, it is well known to use error correction codes (ECC). For example, parity information can be encoded with data into a plurality of codewords that are stored in the memory array 202. When the data is read, a decoding process is performed to separate the data from the parity information and fix any errors. If that ECC decoding process (performed during the read process of step 1602) takes too long (step 1606), which indicates that a lot of errors needed to be fixed by the ECC decoding process, then the control circuit will perform a refresh process for the data in step 1608. For example, the control circuit performs the refresh process of FIGS. 7, 8 and/or 14. If the ECC decoding process did not take too long, then no refresh process is performed (step 1610).

FIG. 17 is a flow chart describing one embodiment of a process for refreshing data. The process of FIG. 17 is performed by any of the embodiments of a control circuit discussed above. In one example embodiment, the process of FIG. 17 is performed by integrated memory assembly 207 using any of the embodiments of a control circuit discussed above of control die 211 to program memory cells (e.g., NAND strings of memory structure 202) on memory die 201. In one embodiment, the process of FIG. 17 is performed at the direction of state machine 262 (or another processor). The control circuit is connected to the memory cells (e.g., via control lines such as word lines, bit lines, source line and select lines), as described above with respect to FIGS. 1-4J.

In step 1702, the control circuit programs data to memory cells. For example, the control circuit programs data to memory cells connected to a common word line. (e.g., in the same sub-block or in multiple sub-blocks) using the process of FIG. 6. Subsequent to the programming of the data, the control circuit periodically checks the length of time since the data has been programmed or refreshed in step 1704. In step 1706, it is determined whether the length of time since the data has been programmed or refreshed is too long (e.g., greater than a predetermined period of time calculated for the particular structure/design to avoid data retention issues). If the length of time is too long, then a data refresh process is performed for the data in step 1708. For example, the control circuit performs the refresh process of FIGS. 7, 8 and/or 14. After step 1708, or if it was determined in step 1706 that the length of time is not too long, then the control circuit continues to periodically checks the length of time since the data has been programmed or refreshed in step 1704.

A memory system has been disclosed that identifies memory cells that have had their threshold voltage unintentionally drift lower than programmed due to data retention issues and refreshes the data for those memory cells to be as originally intended, therefore, avoiding errors when reading the data.

One embodiment includes a non-volatile storage apparatus, comprising: a plurality of non-volatile memory cells and a control circuit connected to the memory cells. The control circuit is configured to: identify a first set of memory cells connected to a common word line that have threshold voltages within an offset of a read compare voltage of a first data state; determine whether adjacent memory cells that are adjacent to the first set of memory cells are in one or more low data states, the adjacent memory cells are connected to word lines that are adjacent to the common word line; and perform first programming for memory cells of the first set of memory cells that have respective adjacent memory cells determined to be in one or more low data states, the first programming results in the memory cells receiving the first programming being in the first data state.

One embodiment includes a method of operating non-volatile memory, comprising: identifying memory cells connected to a common word line that have had their threshold voltage unintentionally drift lower than programmed; and performing programming on the memory cells identified to have had their threshold voltage unintentionally drift lower than programmed without performing programming for memory cells that are connected to the common word line that were not identified to have had their threshold voltage unintentionally drift lower than programmed. The performing programming is performed without relocating data stored in any memory cell connected to the common word line.

One embodiment includes a non-volatile storage apparatus, comprising: a plurality of NAND strings; a plurality of word lines connected to the NAND strings; a plurality of bit lines connected to the NAND strings; and a control circuit connected to the word lines and the bit lines, the control circuit is configured to program data to the NAND strings and read data from the NAND strings. In response to a read process failing for a plurality of memory cells that are part of the NAND strings and are connected to a particular word line of the plurality of word lines, the control circuit is configured to: perform a first sensing operation for each of the memory cells of the plurality of memory cells to determine whether the memory cells have respective threshold voltages above respective lower voltage limits, the respective lower voltage limits are respective read compare voltages for intended data states less a first set of one or more voltage magnitudes; perform a second sensing operation for each of the memory cells of the plurality of memory cells to determine whether the memory cells have respective threshold voltages below respective upper voltage limits, the respective upper voltage limits are respective read compare voltages for intended data states plus a second set of one or more voltage magnitudes; for memory cells of the plurality of memory cells that are part of the NAND strings and are connected to the particular word line, read both neighbor memory cells that are on word lines next to the particular word line to determine whether the neighbor memory cells are in low threshold voltage data states; and refresh data as originally intended for the memory cells of the plurality of memory cells that are part of the NAND strings and are connected to the particular word line that are determined from the first sensing operation to have threshold voltages above respective lower voltage limits, determined from the second sensing operation to have threshold voltages below respective upper voltage limits and have both neighbor memory cells determined to be in low threshold voltage data states.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via one or more intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
a plurality of non-volatile memory cells capable of being programmed to a plurality of data states, the plurality of data states includes one or more low data states and a high data state, the one or more low data states include lower threshold voltages than the high data state, the plurality of data states includes a first data state; and
a control circuit connected to the memory cells, the control circuit is configured to:
in response to a read process other than program verify, perform one or more sensing operations to identify a first set of memory cells connected to a common word line that have threshold voltages within an offset of a read compare voltage of the first data state;
determine whether adjacent memory cells that are adjacent to the first set of memory cells are in the one or more low data states, the adjacent memory cells are connected to word lines that are adjacent to the common word line; and
perform first programming for memory cells of the first set of memory cells that have respective adjacent memory cells determined to be in the one or more low data states, the first programming results in the memory cells receiving the first programming being in the first data state.

2. The non-volatile storage apparatus of claim 1, wherein the control circuit is further configured to:
identify a second set of memory cells connected to the common word line that have threshold voltages within an offset of a read compare voltage of a second data state and a third set of memory cells connected to the common word line that have threshold voltages within an offset of a read compare voltage of a third data state, the plurality of data states includes the second data state and the third data state;
determine whether adjacent memory cells that are adjacent to the second set of memory cells are in the one or more low data states and whether adjacent memory cells that are adjacent to the third set of memory cells are in the one or more low data states;
perform second programming for memory cells of the second set of memory cells that have respective adjacent memory cells determined to be in the one or more low data states, the second programming results in the memory cells receiving the second programming being in the second data state; and
perform third programming for memory cells of the third set of memory cells that have respective adjacent memory cells determined to be in the one or more low data states, the third programming results in the memory cells receiving the third programming being in the third data state.

3. The non-volatile storage apparatus of claim 2, wherein:
the first programming is performed at a different time than the second programming and the third programming; and
the second programming is performed at a different time than the third programming.

4. The non-volatile storage apparatus of claim 2, wherein:
the first programming includes applying a programming signal starting at a first voltage magnitude;
the second programming includes applying a programming signal starting at a second voltage magnitude, the second magnitude is greater than the first magnitude; and the third programming includes applying a programming signal starting at a third voltage magnitude, the third magnitude is greater than the second magnitude.

5. The non-volatile storage apparatus of claim 1, wherein the control circuit is configured to identify the first set of memory cells connected to the common word line that have threshold voltages within the offset of the read compare voltage of a first data state by:
performing a first sensing operation to determine whether memory cells have respective threshold voltages above a lower voltage limit, the lower voltage limit is the read compare voltage for the first data state less the offset;
performing a second sensing operation to determine whether memory cells have respective threshold voltages below an upper voltage limit, the upper voltage limit is the read compare voltage for the first data state plus the offset; and
determining which memory cells have respective threshold voltages above the lower voltage limit and below the upper voltage limit.

6. The non-volatile storage apparatus of claim 5, wherein:
the control circuit is configured to perform the first sensing operation by applying a sensing voltage to the common word line equal to the lower voltage limit and determining which memory cells turn on; and
the control circuit is configured to perform the second sensing operation by applying a sensing voltage to the common word line equal to the upper voltage limit and determining which memory cells turn off.

7. The non-volatile storage apparatus of claim 1, wherein:
the one or more low data states include an erased state and a programmed data state having lowest threshold voltages of programmed data states.

8. The non-volatile storage apparatus of claim 1, wherein:
the one or more low data states include up to 40% of all data states.

9. The non-volatile storage apparatus of claim 1, wherein:
the plurality of non-volatile memory cells store three bits of data per memory cell; and
the one or more low data states include up to three data states having lowest threshold voltages of data states.

10. The non-volatile storage apparatus of claim 1, wherein:
the plurality of non-volatile memory cells store four bits of data per memory cell; and
the one or more low data states include up to four data states having lowest threshold voltages of data states.

11. The non-volatile storage apparatus of claim 1, wherein:
the first programming refreshes data to be as originally intended for the first set of memory cells that have respective adjacent memory cells determined to be in the one or more low data states.

12. The non-volatile storage apparatus of claim 1, wherein:
the plurality of non-volatile memory cells store multiple bits of data per memory cell in multiple data states;
the multiple data states are divided into zones based on threshold voltages; and
the control circuit is configured to perform the first programming by applying different magnitudes of programming based on which zones adjacent memory cells are in.

13. The non-volatile storage apparatus of claim 1, wherein:
the control circuit is configured to perform the first programming by applying a single programming voltage pulse to the common word line.

14. The non-volatile storage apparatus of claim 1, wherein:
the control circuit is configured to perform the first programming by performing a programming process that applies multiple programming voltage pulses to the common word line and performing verification between programming voltage pulses until the memory cells receiving the first programming are in the first data state.

15. The non-volatile storage apparatus of claim 1, wherein:
the control circuit is configured to identify the first set of memory cells in response to a read process failing for memory cells connected to the common word line.

16. The non-volatile storage apparatus of claim 1, wherein:
the control circuit is configured to identify the first set of memory cells, determine whether adjacent memory cells that are adjacent to the first set of memory cells are in one or more low data states, and perform the first programming without relocating data stored in the memory cells of the first set of memory cells that have respective adjacent memory cells determined to be in the one or more low data states.

17. The non-volatile storage apparatus of claim 1, wherein:
the plurality of non-volatile memory cells are part of a three dimensional memory structure that comprises a plurality of NAND strings, a plurality of word lines connected to the NAND strings, and a plurality of bit lines connected to the NAND strings;
the plurality of word lines includes the common word line and the word lines that are adjacent to the common word line; and
the control circuit is connected to the plurality of word lines and the plurality of bit lines.

18. A method of operating non-volatile memory, comprising:
identifying memory cells connected to the common word line that have had their threshold voltages unintentionally drift lower than programmed, the memory cells are capable of being programmed to a plurality of data states, the plurality of data states includes low data states and a high data state, the low data states include lower threshold voltages than the high data state, the identifying comprises:
performing a first sensing operation to determine whether memory cells have respective threshold voltages above a lower voltage limit, the lower voltage limit is a read compare voltage for a data state less a first offset,
performing a second sensing operation to determine whether memory cells have respective threshold voltages below an upper voltage limit, the upper voltage limit is the read compare voltage for the data state plus a second offset,
determining which memory cells have respective threshold voltages above the lower voltage limit and below the upper voltage limit, and
identifying memory cells that have had their threshold voltages unintentionally drift lower than programmed as the memory cells that were determined to have respective threshold voltages above the lower voltage limit and below the upper voltage limit and have neighbor memory cells on neighbor word lines in one or more low data states; and performing programming on the memory cells identified to have had their threshold voltages unintentionally drift lower than programmed without performing programming for memory cells that are connected to the common word line that were not identified to have had their threshold voltage unintentionally drift lower than programmed.

19. The method of claim 18, wherein:

the first offset is equal to the second offset; and the performing programming is performed without relocating data stored in any memory cell connected to the common word line.

20. A non-volatile storage apparatus, comprising:

a plurality of NAND strings comprising non-volatile memory cells capable of being programmed to a plurality of data states, the plurality of data states includes low threshold voltage data states and a high threshold voltage data state, the low threshold voltage data states include lower threshold voltages than the high threshold voltage data state;

a plurality of word lines connected to the NAND strings;

a plurality of bit lines connected to the NAND strings; and a control circuit connected to the plurality of word lines and the plurality of bit lines, the control circuit is configured to program data to the NAND strings and read data from the NAND strings;

in response to a read process failing for a plurality of memory cells of the NAND strings that are connected to a particular word line of the plurality of word lines, the control circuit is configured to:

perform a first sensing operation for each of the memory cells of the plurality of memory cells to determine whether the memory cells have respective threshold voltages above respective lower voltage limits, the respective lower voltage limits are respective read compare voltages for intended data states less a first set of one or more voltage magnitudes;

perform a second sensing operation for each of the memory cells of the plurality of memory cells to determine whether the memory cells have respective threshold voltages below respective upper voltage limits, the respective upper voltage limits are respective read compare voltages for intended data states plus a second set of one or more voltage magnitudes;

for memory cells of the plurality of memory cells that are part of the NAND strings and are connected to the particular word line, read both neighbor memory cells that are on word lines next to the particular word line to determine whether the neighbor memory cells are in the low threshold voltage data states; and refresh data as originally intended for the memory cells of the plurality of memory cells of the NAND strings that are connected to the particular word line that are determined from the first sensing operation to have threshold voltages above respective lower voltage limits, determined from the second sensing operation to have threshold voltages below respective upper voltage limits and have both neighbor memory cells determined to be in low threshold voltage data states.

* * * * *